(12) United States Patent
Jeong

(10) Patent No.: US 7,674,154 B2
(45) Date of Patent: Mar. 9, 2010

(54) APPARATUS AND METHOD FOR POLISHING OBJECTS USING OBJECT CLEANERS

(75) Inventor: In Kwon Jeong, Cupertino, CA (US)

(73) Assignee: KoMiCo Technology, Inc., Austin, TX (US)

( * ) Notice: Subject to any disclaimer, the term of this patent is extended or adjusted under 35 U.S.C. 154(b) by 342 days.

(21) Appl. No.: 11/517,903

(22) Filed: Sep. 8, 2006

(65) Prior Publication Data

US 2007/0060023 A1    Mar. 15, 2007

Related U.S. Application Data

(60) Provisional application No. 60/715,751, filed on Sep. 9, 2005, provisional application No. 60/830,258, filed on Jul. 12, 2006.

(51) Int. Cl.
*B24B 49/00* (2006.01)
(52) U.S. Cl. .................. 451/5; 451/8; 451/11; 451/285; 451/286; 451/287; 451/288; 451/289; 451/290
(58) Field of Classification Search ......... 451/285–290, 451/388, 5, 8, 11
See application file for complete search history.

(56) References Cited

U.S. PATENT DOCUMENTS

| | | | | |
|---|---|---|---|---|
| 6,379,230 B1 * | 4/2002 | Hayashi et al. | ............. | 451/292 |
| 6,562,184 B2 * | 5/2003 | Sommer | ................ | 156/345.12 |
| 6,656,028 B2 * | 12/2003 | Chokshi et al. | ............. | 451/339 |
| 7,022,000 B2 * | 4/2006 | Mizomoto et al. | ............ | 451/65 |
| 7,059,944 B2 * | 6/2006 | Ashjaee et al. | ................ | 451/54 |
| 7,223,153 B2 * | 5/2007 | Jeong | .......................... | 451/11 |
| 2004/0209550 A1 | 10/2004 | Jeong | | |
| 2004/0221391 A1 | 11/2004 | Allen et al. | | |
| 2005/0127724 A1 | 6/2005 | Irwin et al. | | |

* cited by examiner

*Primary Examiner*—Joseph J Hail, III
*Assistant Examiner*—Shantese McDonald
(74) *Attorney, Agent, or Firm*—Thomas H. Ham; Wilson & Ham

(57) ABSTRACT

An apparatus and method for polishing objects, such as semiconductor wafers, uses at least one object cleaner, which may be a movable object cleaner. The movable object cleaner allows access to different parts of the apparatus for maintenance.

29 Claims, 13 Drawing Sheets

APPARATUS AND METHOD FOR POLISHING OBJECTS USING OBJECT CLEANERS

CROSS REFERENCE TO RELATED APPLICATION

This application is entitled to the benefit of U.S. Provisional Patent Application Ser. Nos. 60/715,751, filed on Sep. 9, 2005, and 60/830,258, filed on Jul. 12, 2006, which are both incorporated herein by reference.

FIELD OF THE INVENTION

The invention relates generally to semiconductor processing equipments, and more particularly to an apparatus and method for polishing semiconductor wafers.

BACKGROUND OF THE INVENTION

Local and global planarization of semiconductor wafers becomes increasingly important as more metal layers and interlayer dielectric layers are stacked on the wafers. A preferred method to planarize semiconductor wafers is the chemical mechanical polishing (CMP) method, where a surface of a semiconductor wafer is polished using a slurry solution supplied between the wafer and a polishing pad. The CMP method is also widely used for damascene process to form copper structures on the semiconductor wafers.

In general, a CMP equipment includes a polishing table where a polishing pad is placed and a wafer carrier that supports a semiconductor wafer and presses the wafer against the polishing pad. The CMP equipment may also include a wafer cleaner to clean and dry the polished wafers.

One of the most important considerations of a CMP equipment is productivity. For higher productivity, a CMP equipment typically requires more polishing tables and more wafer carriers. As the number of polishing tables and wafer carriers included in a CMP equipment is increased, the arrangement of the polishing tables and the wafer carriers becomes important to efficiently polish multiple semiconductor wafers. Furthermore, the manner in which the semiconductor wafers are transferred to and from the wafer carrier and the wafer cleaner becomes important as well. However, the footprint of a CMP equipment must also be considered since a CMP equipment with a large footprint requires a larger clean room to house the equipment, which translates into greater cost of operation.

In view of these issues, what is needed is an apparatus and method for polishing semiconductor wafer with high productivity, which does not require a large footprint.

SUMMARY OF THE INVENTION

An apparatus and method for polishing objects, such as semiconductor wafers, uses at least one object cleaner, which may be a movable object cleaner. The movable object cleaner allows access to different parts of the apparatus for maintenance. The movable object cleaner also allows the apparatus to have a smaller footprint. The apparatus may include a polishing station that comprises multiple polishing units to increase the productivity of the apparatus.

An apparatus for polishing objects in accordance with an embodiment of the invention comprises a polishing station, a movable object cleaner, an object transport device and a guide mechanism. The polishing station includes at least one polishing unit to polish the objects. The movable object cleaner is positioned adjacent to a side of the polishing station. The movable object cleaner includes a cleaning station and a drying station. The object transport device is positioned to transfer the objects from the polishing station to the movable object cleaner. The guide mechanism is operatively connected to the polishing station and the movable object cleaner. The guide mechanism is configured to allow the movable object cleaner to be displaced from an initial position to a subsequent position to provide access to parts of the polishing station. The guide mechanism is further configured to allow the movable object cleaner to be displaced back to the initial position from the subsequent position.

An apparatus for polishing objects in accordance with an embodiment of the invention comprises a polishing station, a movable object cleaner, an object transport device and a guide mechanism. The polishing station includes a plurality of polishing units to polish the objects and at least one object relay device to transfer the objects between the polishing units. The polishing station is rectangular in shape with two longer sides and two shorter sides. The movable object cleaner is positioned adjacent to one of the two longer sides of the polishing station. The movable object cleaner includes a cleaning station and a drying station. The object transport device is positioned to transfer the objects from the polishing station to the movable object cleaner. The guide mechanism is operatively connected to the polishing station and the movable object cleaner. The guide mechanism is configured to allow the movable object cleaner to be displaced from an operational position to a maintenance position to provide access to parts of the polishing station. The guide mechanism is further configured to allow the movable object cleaner to be displaced back to the operational position from the maintenance position.

An apparatus for polishing objects in accordance with another embodiment of the invention comprises a polishing station, first and second object cleaners and at least one object transport device. The polishing station comprises first and second polishing units and first and second object relay devices. Each of the first and second polishing units includes a polishing table and first and second object carriers. The first and second object relay devices are positioned between the first polishing unit and the second polishing unit. The first object relay device is positioned to transfer a first object from the first object carrier of the first polishing unit to the first object carrier of the second polishing unit along an original direction. The second object relay device is positioned to transfer a second object from the second object carrier of the first polishing unit to the second object carrier of the second polishing unit along the original direction. The first and second object cleaners are positioned near the polishing station. Each of the first and second object cleaners includes a cleaning station and a drying station. The first object cleaner is configured to process the first object at the cleaning station and the drying station of the first object cleaner such that the first object is transferred along a return direction within the first object cleaner. The second object cleaner is configured to process the second object at the cleaning station and the drying station of the second object cleaner such that the second object is transferred along the return direction within the second object cleaner. The return direction is the opposite direction of the original direction. The at least one object transport device is positioned to transfer the first object from the polishing station to the first object cleaner and to transfer the second object from the polishing station to the second object cleaner.

A method of polishing objects in accordance with an embodiment of the invention comprises transferring a first object from a first object carrier of a first polishing unit to a first object relay device and from the first object relay device to a first object carrier of a second polishing unit along an original direction within a polishing station, including polishing the first object at the first and second polishing units, transferring a second object from a second object carrier of the first polishing unit to a second object relay device and from the second object relay device to a second object carrier of the second polishing unit along the original direction within the polishing station, including polishing the second object at the first and second polishing units, transferring the first object from the polishing station to a first object cleaner and the second object from the polishing station to a second object cleaner, each of the first and second object cleaners including a cleaning station and a drying station, processing the first object at the cleaning station and the drying station of the first object cleaner such that the first object is transferred along a return direction within the first object cleaner, the return direction being the opposite direction of the original direction, and processing the second object at the cleaning station and the drying station of the second object cleaner such that the second object is transferred along the return direction within the second object cleaner.

Other aspects and advantages of the present invention will become apparent from the following detailed description, taken in conjunction with the accompanying drawings, illustrated by way of example of the principles of the invention.

DETAILED DESCRIPTION

Figure 1:
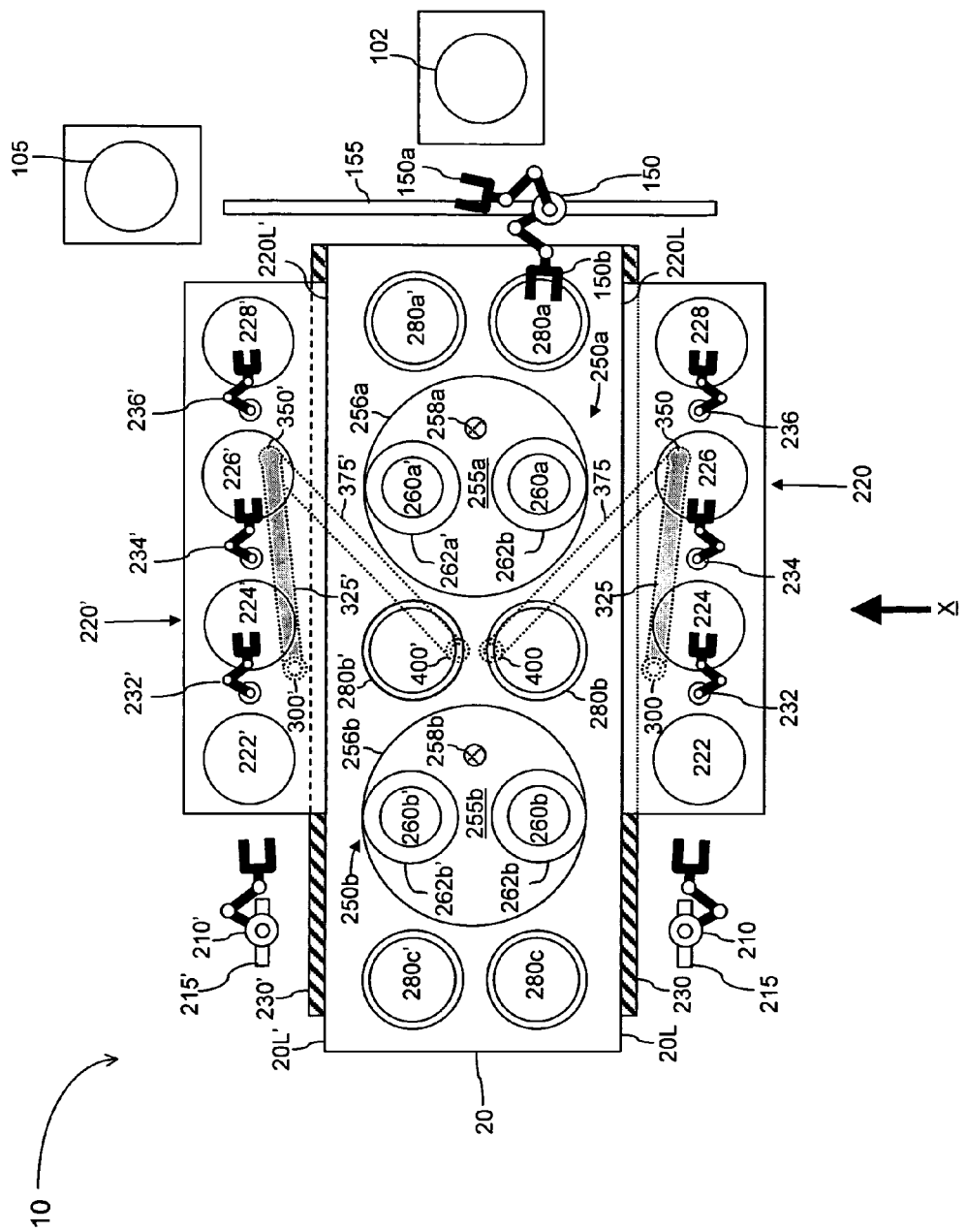
FIG. 1 is a top view of a polishing apparatus in accordance with an embodiment of the present invention.
Figure 2:
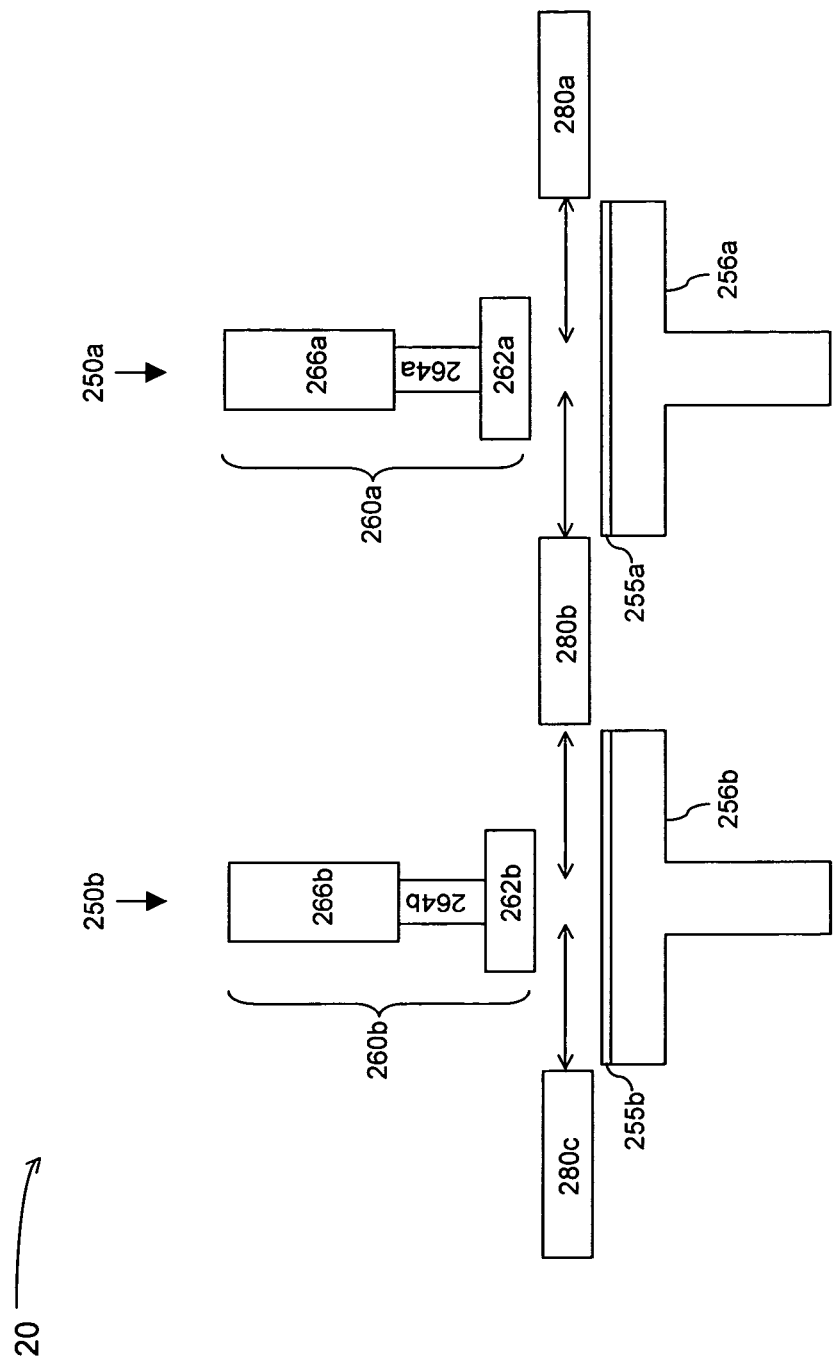
FIG. 2 is a side view of polishing units and wafer relay devices of a polishing station of the polishing apparatus of FIG. 1, which shows how the wafer relay devices linearly move to transfer wafers between the polishing units in accordance with an embodiment of the invention.
Figure 3:
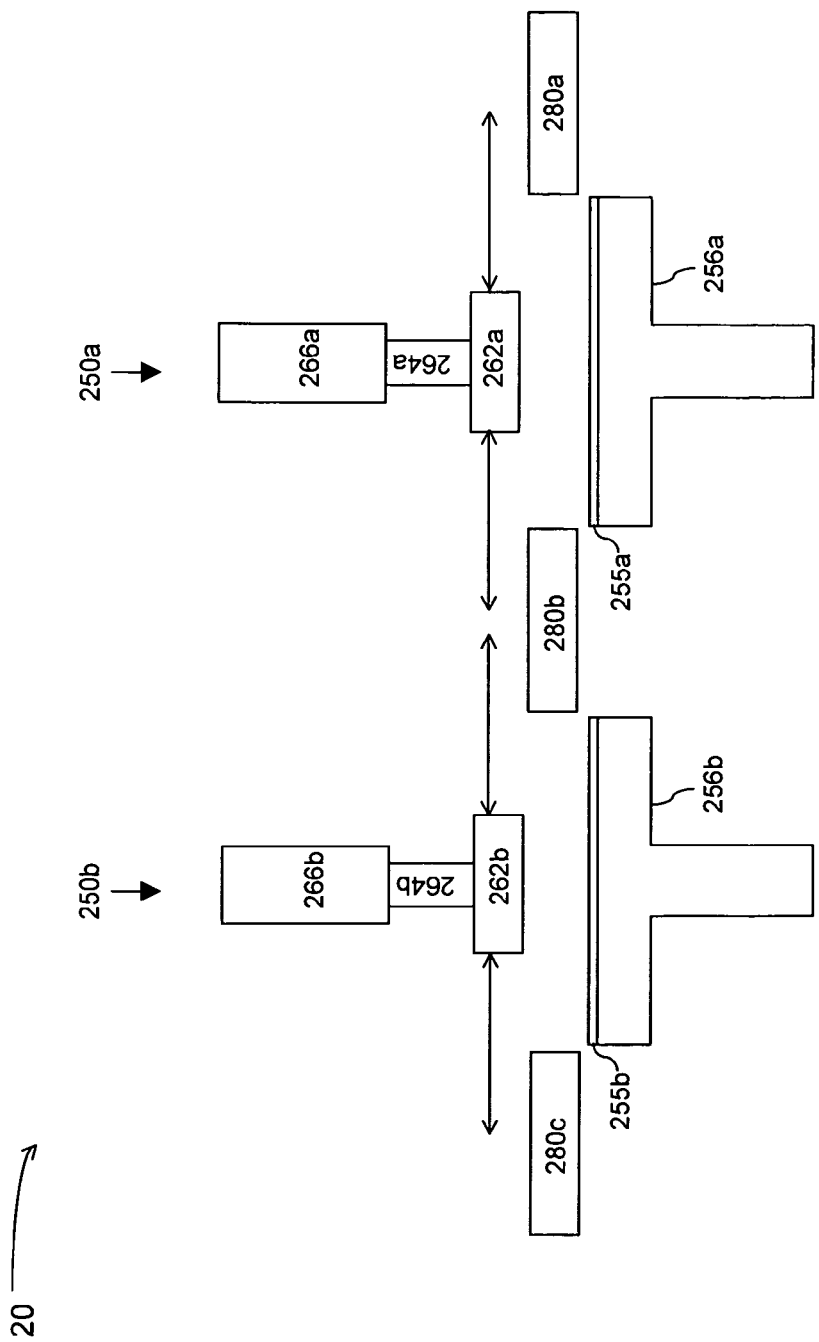
FIG. 3 is a side view of the polishing units and the wafer relay devices of the polishing station of the polishing apparatus of FIG. 1, which shows how wafer carrier assemblies of the polishing units linearly move to transfer wafers between the polishing units in accordance with another embodiment of the invention.

With reference to FIGS. 1, 2 and 3, a polishing apparatus 10 in accordance with an embodiment of the present invention is described. FIG. 1 is a top view of the polishing apparatus 10. FIGS. 2 and 3 are side views of components of a polishing station 20 of the polishing apparatus 10. The polishing apparatus 10 comprises the polishing station 20, a wafer storage station 102, a first wafer transport device 150, a second wafer transport device 210, a third wafer transport device 210', a first movable wafer cleaner 220 and a second movable wafer cleaner 220'.

The polishing station 20 is an enclosed structure with window-like mechanisms (not shown) that can be opened to transfer semiconductor wafers into and out of the polishing station 20. As shown in FIG. 1, the polishing station 20 in this embodiment is rectangular in shape with two longer sides 20L and 20L' and two shorter sides. The polishing station 20 comprises a first polishing unit 250a, a second polishing unit 250b, first two wafer relay devices 280a and 280a', second two wafer relay devices 280b and 280b', and third two wafer relay devices 280c and 280c'.

Each polishing unit 250 of the polishing station 20 comprises a polishing table 256, a first wafer carrier assembly 260 and a second wafer carrier assembly 260'. The polishing table 256 can be rotated or orbited about an axis. A polishing pad 255 may be attached onto the polishing table 256 for chemical and mechanical polishing process of semiconductor wafers. One or more slurries containing abrasive particles and/or chemicals such as KOH are used with the polishing pad 255 to polish semiconductor wafers. Each polishing unit 250 may further comprises a pad conditioner 258 to condition the surface of the polishing pad 255 during the polishing process to refresh the surface of the polishing pad 255 for proper polishing. Although the polishing processes of wafers are described herein as being performed on one or more polishing pad surfaces, the wafer polishing processes may be performed on any polishing surface such as a polishing surface of a polishing table. The area of the polishing station 20 is an area roughly defined by the polishing tables 256a and 256b of the polishing station 20.

Each wafer carrier assembly 260 of the polishing units 250a and 250b comprises a wafer carrier 262, a carrier shaft 264 and a rotational-and-vertical drive mechanism 266, as illustrated in FIGS. 2 and 3. The wafer carrier 262 is designed to hold a semiconductor wafer such that the surface of the wafer to be polished is faced toward the polishing pad 255. The wafer carrier 262 is connected to the rotational-and-vertical drive mechanism 266 through the carrier shaft 264. The rotational-and-vertical drive mechanism 266 controls the rotational and vertical motions of the wafer carrier 262 through the connected carrier shaft 264. Thus, the rotational-and vertical drive mechanism 266 is configured to rotate the wafer carrier 262 by rotating the connected carrier shaft 264 and to vertically move the wafer carrier 262 by vertically moving the connected carrier shaft 264. In order to polish semiconductor wafers, the wafer carriers 262 are moved down to the respective polishing pads 255 by the respective rotating-and-vertical mechanisms 266 to press the wafers held by the wafer carriers 262 onto the respective polishing pads 255.

The wafer relay devices 280 of the polishing station 20 accommodate wafers transferred to and from the wafer relay devices 280. Each wafer relay device 280 includes a load-and-unload cup (commonly known in the semiconductor industry as a load cup) to receive or unload a wafer released from a wafer carrier and to place or load a wafer onto a wafer carrier. The wafer relay devices 280 and the two polishing units 250 are arranged in such a manner that the first two wafer relay devices 280a and 280a' are positioned in front of the first polishing unit 250a, the second two wafer relay devices 280b and 280b' are positioned between the first polishing unit 250a and the second polishing unit 250b, and the third two wafer relay devices 280c and 280c' are positioned behind the second polishing unit 250c, as illustrated in FIG. 1. Positions of the wafer relay devices 280 in FIG. 1 are their respective parking positions.

The wafer cleaners 220 and 220' are enclosed structures with window-like like mechanisms (not shown) that can be opened to transfer semiconductor wafers into and out of the wafer cleaners. The first wafer cleaner 220 comprises a wafer receiving station 222, a first cleaning station 224, a second cleaning station 226, a drying station 228, a first wafer transport device 232, a second wafer transport device 234 and a third wafer transport device 236. The wafer receiving station 222 accommodates wafers that are transferred by the second wafer transport device 210. The first wafer transport device 232 transfers wafers from the wafer receiving station 222 to the first cleaning station 224. The second wafer transport device 234 transfers wafers from the first cleaning station 224 to the second cleaning station 226. The third wafer transport device 236 transfers wafers from the second cleaning station 226 to the drying station 228. Dried wafers are removed from the drying station 228 by the first wafer transport device 150 and then transferred to the wafer storage station 102.

The first and second cleaning stations 224 and 226 of the wafer cleaner 220 remove slurry particles from wafer surfaces using D.I. water and/or chemicals, such as $NH_4OH$, diluted HF and organic chemicals. The wafer receiving station 222 can be also configured to remove slurry particles from wafer surfaces using D.I. water and/or chemicals, such as $NH_4OH$, diluted HF and organic chemicals. After the cleaning process is completed at the second cleaning station 226, wafers are rinsed with D.I. water and then dried in the drying station 228.

The wafer cleaner 220 may comprise more than two cleaning stations or may comprise a single cleaning station. In this embodiment, the second wafer cleaner 220' is identical to the first wafer cleaner 220. As shown in FIG. 1, each of the wafer cleaners 220 and 220' in this embodiment is rectangular in shape with two longer sides and two shorter sides. In order to minimize the width of the polishing apparatus 10, the wafer cleaners 220 and 220' are positioned such that their respective longer sides 220L and 220L' are facing the longer sides 20L and 20L' of the polishing station 20, respectively, as illustrated in FIG. 1. The wafer cleaner 220 is positioned adjacent to the polishing station 20 such that the longer side 220L of the wafer cleaner 220 is facing the longer side 20L of the polishing station 20. The longer side 220L of the wafer cleaner 220 facing the polishing station 20 may or may not be in contact with the longer side 20L of the polishing station. Similarly, the wafer cleaner 220' is positioned adjacent to the polishing station 20 such that the longer side 220L' of the wafer cleaner 220' is facing the longer side 20L' of the polishing station 20. The longer side 220L' of the wafer cleaner 220' facing the polishing station 20 may or may not be in contact with the longer side 20L' of the polishing station.

The wafer storage station 102 accommodates semiconductor wafers or other comparable objects to be polished by the polishing station 20. The wafer storage station 102 can also accommodate semiconductor wafers or other comparable objects that have been polished and cleaned by the polishing station 20 and the wafer cleaners 220 and 220'.

The first wafer transport device 150 transfers wafers from the wafer storage station 102 to the polishing station 20. More specifically, the first wafer transport device 150 transfers wafers from the wafer storage station 102 to the first wafer relay devices 280a and 280a' of the polishing station 20. The second wafer transport device 210 transfers wafers from the polishing station 20 to the first wafer cleaner 220. More specifically, the second wafer transport device 210 transfers wafers from the third wafer relay device 280c of the polishing station 20 to the wafer receiving station 222 of the first wafer cleaner 220. The third wafer transport device 210' transfers wafers from the polishing station 20 to the wafer second cleaner 220'. More specifically, the third wafer transport device 210' transfers wafers from the third wafer relay device 280c' of the polishing station 20 to the wafer receiving station 222' of the second wafer cleaner 220'. The first wafer transport device 150 also transfers wafers from the first and second wafer cleaners 220 and 220' to the wafer storage station 102. More specifically, the first wafer transport device 150 transfers wafers from the drying stations 228 and 228' of the first and second wafer cleaners 220 and 220' to the wafer storage station 102.

The first, second and third wafer transport devices 150, 210 and 210' may be situated on respective linear tracks 155, 215 and 215' such that the wafer transport devices can be moved in a linear manner on the linear tracks by respective linear drive mechanisms (not shown). As an example, the first, second and third wafer transport devices 150, 210 and 210' may comprise a robotic arm to handle a wafer for transfer. The first wafer transport device 150 may be configured to comprise dual robotic arms 150a and 150b, as illustrated in FIG. 1, such that each robotic arm 150a or 150b can handle wafers individually. The first, second and third wafer transport devices 150, 210 and 210' may also be configured to turn over wafers before transferring the wafers to the polishing station 20, the wafer cleaner 220 or the wafer cleaner 220'.

In an embodiment of the present invention, the polishing apparatus 10 further comprises a buffer station 105. The buffer station 105 accommodates wafers to be polished by the polishing station 20. In this embodiment, the first robotic arm 150a of the first wafer transport device 150 transfers wafers from the wafer storage station 102 to the buffer station 105 and the second robotic arm 150b of the first wafer transport device 150 transfers wafers from the buffer station 105 to the polishing station 20. Cleaned wafers at the wafer cleaners 220 and 220' are transferred from the wafer cleaners only by the first robotic arm 150a of the first wafer transport device 150. The first robotic arm 150a, which is used to transfer clean wafers between the storage station 102, the buffer station 105 and the wafer cleaners 220 and 220', does not enter the polishing station 20 which is contaminated by slurry.

In an alternative configuration, the polishing apparatus 10 of FIG. 1 can be modified such that the second wafer transport device 210 transfers wafers from the polishing station 20 to both the first and second wafer cleaners 220 and 220'. In this alternative configuration, the linear track 215 is positioned next to the polishing station 20 near the wafer relay devices 280c and 280c' such that the wafer transport device 210 can reach both the wafer receiving stations 222 and 222' of the wafer cleaners 220 and 220', respectively, as well as the wafer relay devices 280c and 280c'. In operation, the second wafer transport device 210 transfer wafers from the wafer relay devices 280c and 280c' of the polishing station 20 to the wafer receiving stations 222 and 222' of first and second wafer cleaners 220 and 220', respectively. Thus, in this alternative configuration, the third wafer transport device 210' is not needed, and thus, is removed from the polishing apparatus 10.

With reference to FIGS. 1 and 2, a method of processing wafers in the polishing apparatus 10 according to an embodiment of the present invention is described. In this embodiment, the wafer relay devices 280 of the polishing station 20 are connected to ancillary devices (not shown), which move the wafer relay devices linearly in order to deliver wafers to their next destinations. Details of how to move the wafer relay devices 280 linearly and the ancillary devices that are used to move the wafer relay devices 280 have been described with reference to FIGS. 9-17 of U.S. patent application Ser. No. 10/829,593, filed on Apr. 21, 2004, which is incorporated herein by reference.

First, the first wafer relay devices 280a and 280a' (1) receive wafers at their respective parking positions, as shown in FIG. 1, from the first wafer transport device 150, (2) move linearly to the wafer carriers 262a and 262a' of the first polishing unit 250a, respectively, (3) transfer the wafers to the wafer carriers 262a and 262a' over the polishing table 256a, respectively, and then (4) return to their respective parking positions.

Next, the wafer carriers 262a and 262a' move down to the polishing pad 255a of the polishing table 256a and then polish the wafers.

Next, after the wafers are polished on the polishing pad 255a, the wafer carriers 262a and 262a' are lifted from the polishing pad 255a.

Next, the second wafer relay devices 280b and 280b' (1) move linearly to the wafer carriers 262a and 262a' of the first polishing unit 250a, respectively, from their respective parking positions, as shown in FIG. 1, (2) receive the wafers from the wafer carriers 262a and 262a' over the polishing table 256a, (3) move linearly to the wafer carriers 262b and 262b' of the second polishing unit 250b, respectively, (4) transfer the wafers to the wafer carriers 262b and 262b' over the polishing table 256b, respectively, and then (5) return to their respective parking positions.

Next, the wafer carriers 262b and 262b' move down to the polishing pad 255b of the polishing table 256b and then polish the wafers.

Next, after the wafers are polished on the polishing pad 255b, the wafer carriers 262b and 262b' are lifted from the polishing pad 255b.

Next, the third wafer relay devices 280c and 280c' (1) move linearly to the wafer carriers 262b and 262b' of the second polishing unit 250b, respectively, from their respective parking positions, as shown in FIG. 1, (2) receive the wafers from the wafer carriers 262b and 262b' over the polishing table 256b, and then (4) return to their respective parking positions.

Next, the wafers are removed from the third wafer relay devices 280c and 280c' by the second and third wafer transport devices 210 and 210', respectively, and then transferred to the first and second wafer cleaners 220 and 220', respectively. In the alternative configuration of the polishing apparatus without the third wafer transport device 210', the second wafer transport device 210 removes the wafers from the third wafer relay devices 280c and 280c' and then transfer the wafers to the first and second wafer cleaners 220 and 220'.

With reference to FIGS. 1 and 3, a method of processing wafers in the polishing apparatus 10 according to another embodiment of the present invention is described. In this embodiment, the wafer carrier assemblies 260 are connected to ancillary devices, which move the wafer carrier assemblies linearly in order to deliver wafers to their next destinations. Details of how to move the wafer carrier assemblies 260 linearly and the ancillary devices that are used to move the carrier assemblies 260 linearly have been described with reference to FIGS. 18-28 of U.S. patent application Ser. No. 10/829,593, filed on Apr. 21, 2004, which is incorporated herein by reference.

First, the first wafer relay devices 280a and 280a' receive wafers at their respective parking positions from the first wafer transport device 150.

Next, the wafer carrier assemblies 260a and 260a' of the first polishing unit 250a (1) move linearly to the wafer relay devices 280a and 280a', respectively, from their initial positions over the polishing table 256a, (2) receive the wafers from the wafer relay devices 280a and 280a' at their respective parking positions, and then (3) return to the polishing table 256a of the first polishing unit 250a.

Next, the wafer carriers 262a and 262a' move down to the polishing pad 255a of the polishing table 256a and then polish the wafers.

Next, after the wafers are polished on the polishing pad 255a, the wafer carriers 262a and 262a' are lifted from the polishing pad 255a.

Next, the wafer carrier assemblies 260a and 260a' of the first polishing unit 250a (1) move linearly to the wafer relay devices 280b and 280b', respectively, (2) transfer the wafers to the wafer relay devices 280b and 280b' at their respective parking positions, and then (3) return to the polishing table 256a of the first polishing unit 250a.

Next, the wafer carrier assemblies 260b and 260b' of the second polishing unit 250b (1) move linearly to the wafer relay devices 280b and 280b', respectively, from their initial positions over the polishing table 256b, (2) receive the wafers from the wafer relay devices 280b and 280b' at their respective parking positions, and then (3) return to the polishing table 256b of the second polishing unit 250b.

Next, the wafer carriers 262b and 262b' move down to the polishing pad 255b of the polishing table 256b and then polish the wafers.

Next, after the wafers are polished on the polishing pad 255b, the wafer carriers 262b and 262b' are lifted from the polishing pad 255b.

Next, the wafer carrier assemblies 260b and 260b' of the second polishing unit 250b (1) move linearly to the wafer relay devices 280c and 280c', respectively, (2) transfer the wafers to the wafer relay devices 280c and 280c' at their respective parking positions, and then (3) return to the polishing table 256b of the second polishing unit 250b.

Next, the wafers are removed from the third wafer relay devices 280c and 280c' by the second and third wafer transport devices 210 and 210', respectively, and then transferred to the wafer cleaners 220 and 220', respectively. In the alternative configuration of the polishing apparatus 10 without the third wafer transport device 210', the second wafer transport device 210 removes the wafers from the third wafer relay devices 280c and 280c' and then transfer the wafers to the first and second wafer cleaners 220 and 220'.

In an alternative embodiment of the present invention, the first two wafer relay devices 280a and 280a' of the polishing station 20 in the polishing apparatus 10 of FIG. 1 can be removed. In this embodiment, the first wafer transport device 150 transfers wafers directly to the wafer carriers 262a and 262a' of the first polishing unit 250a.

In another alternative embodiment of the present invention, the third two wafer relay devices 280c and 280c' of the polishing station 20 in the polishing apparatus 10 of FIG. 1 can be removed. In this embodiment, the second and third wafer transport devices 210 and 210' transfer wafers directly from the wafer carriers 262b and 262b' of the second polishing unit 250b to the first and second wafer cleaners 220 and 220', respectively. In the alternative configuration of the polishing apparatus 10 without the third wafer transport device 210', the second wafer transport device 210 transfers wafers directly from the wafer carriers 262b and 262b' of the second polishing unit 250b to the first and second wafer cleaners 220 and 220'.

In another alternative embodiment of the present invention, the first wafer relay devices 280a and 280a' and the third wafer relay devices 280c and 280c' of the polishing station 20 in the polishing apparatus 10 of FIG. 1 can be removed. In this embodiment, the first wafer transport device 150 transfers wafers directly to the wafer carriers 262a and 262a' of the first polishing unit 250a. The second and third wafer transport devices 210 and 210' transfer wafers directly from the wafer carriers 262b and 262b' of the second polishing unit 250b to the first and second wafer cleaners 220 and 220', respectively. In the alternative configuration of the polishing apparatus 10 without the third wafer transport device 210', the second wafer transport device 210 transfers wafers directly from the wafer carriers 262b and 262b' of the second polishing unit 250b to the first and second wafer cleaners 220 and 220'.

With the two wafer cleaners 220 and 220' integrated with the polishing stations 20, higher throughput of the polishing apparatus 10 is achieved. In addition, positioning the wafer cleaners 220 and 220' such that they face the longer sides 20L and 20L' of the polishing stations 20 minimizes the width of the polishing apparatus 10. Therefore, more polishing apparatuses can be installed at smaller clean rooms. When users need to maintain the polishing stations 20 whose longer sides 220L and 220L' are surrounded by the wafer cleaners 220 and 220', the wafer cleaners 220 and 220' can be moved such that the polishing stations 20 are exposed to the users in the following manners.

The configuration of the polishing apparatus 10 allows wafers to be transferred from the polishing station 20 to the wafer cleaners 220 and 220' efficiently. In the polishing station 20, each wafer is transferred on one of two paths along an original direction. The original direction is a linear direction from the front of the polishing apparatus 10, where the wafer storage station 102 is situated, to the back of the polishing apparatus, where the third wafer relay devices 280c and 280c' are situated. The first wafer path in the polishing station 20 involves transferring wafers on the following sequence of elements: the first wafer relay device 280a, the first wafer carrier 262a, the second wafer relay device 280b, the first wafer carrier 262b and the third wafer relay device 280c. The second wafer path in the polishing station 20 involves transferring wafers on the following sequence of elements: the first wafer relay device 280a', the second wafer carrier 262a', the second wafer relay device 280b', the second wafer carrier 262b' and the third wafer relay device 280c'. In the wafer cleaners 220 and 220', each wafer is transferred along a return direction, which is the opposite direction of the original direction.

Figure 4:
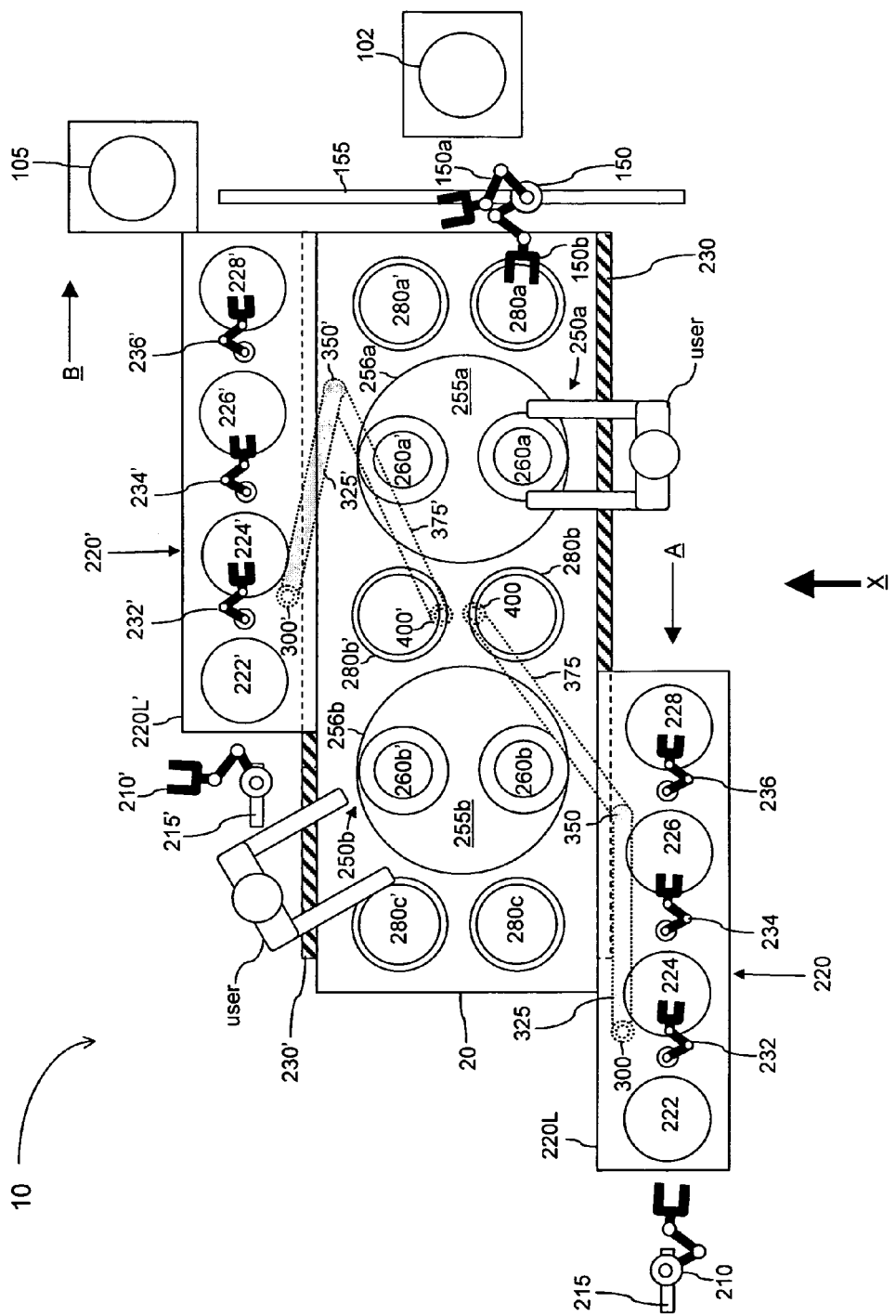
FIG. 4 is a top view of the polishing apparatus of FIG. 1, showing wafer cleaners at their respective maintenance positions.
Figure 5:
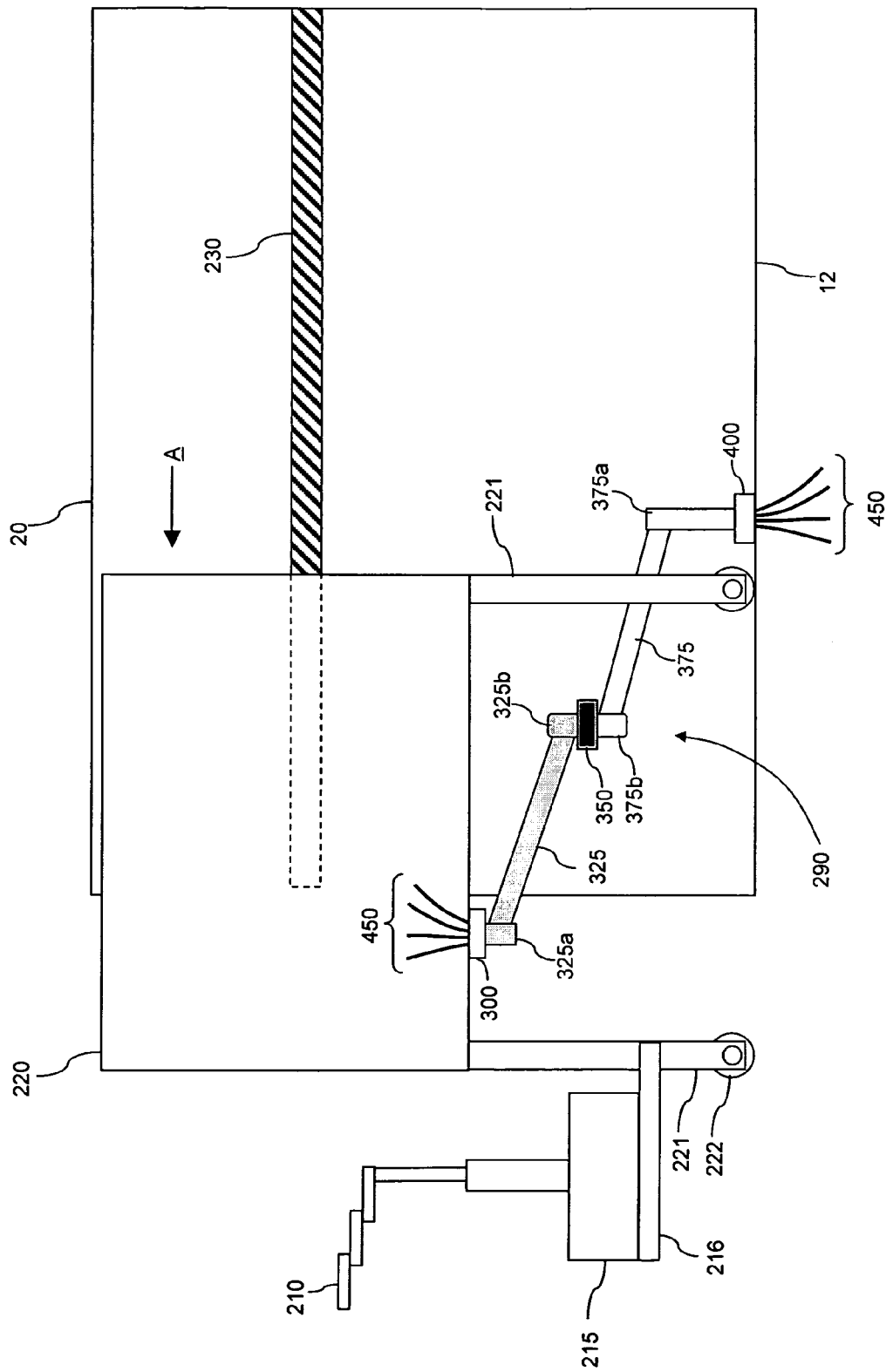
FIG. 5 is a side view of the polishing apparatus of FIG. 1, showing one of the wafer cleaners at its maintenance position.

With reference to FIGS. 1, 4 and 5, an embodiment of the present invention in order to move the wafer cleaners 220 ad 220' is described. FIG. 1 is a top view of the polishing apparatus 10 with the wafer cleaners 220 and 220' located at their respective operational positions. FIG. 4 is a top view of the polishing apparatus 10 with the wafer cleaners 220 and 220' located at their respective maintenance positions. FIG. 5 is a side view of the wafer cleaner 220 (at its maintenance position), a fluid conduit system 290, the second wafer transport device 210 and the polishing station 20, which are viewed from the direction X in FIG. 4.

The polishing apparatus 10 of FIG. 1 comprises linear guides 230 and 230' that are parallel to the longer sides 20L and 20L' of the polishing station 20. The wafer cleaners 220 and 220' are movably connected to the linear guides 230 and 230', respectively, and can be moved in a direction parallel to the longer sides 20L and 20L' of the polishing station 20 along the respective linear guides, as illustrated in FIGS. 4 and 5. The second and third wafer transport devices 210 and 210' and the linear tracks 215 and 215' can be configured to move together with the wafer cleaners 220 and 220', respectively, as illustrated in FIG. 4, when the wafer cleaners 220 and 220' are moved. As an example, the linear tracks 215 and 215' may be attached to the wafer cleaners 220 and 220', respectively, by a suitable connecting structure 216, as illustrated in FIG. 5.

Since the wafer cleaners 220 and 220' are identical in this embodiment, only the wafer cleaner 220 is described in detail. As illustrated in FIG. 5, the wafer cleaner 220 is mounted on multiple supports 221 such that the fluid conduit system 290 can be installed under the wafer cleaner 220. The wafer cleaner 220 is also mounted on wheels 222 through the multiple supports 221 such that the wafer cleaners 220 can be rolled on the wheels 222. Instead of the wheels 222, other devices can be used that minimize friction of moving the wafer cleaner 220 across a floor (not shown) of a facility where the polishing apparatus 10 is installed.

When the first wafer cleaner 220 is moved in the direction A, as illustrated in FIG. 4, users can access the first and second wafer relay devices 280a and 280b, the wafer carrier assembly 260a and the polishing table 256a of the polishing station 20 in order to maintain them. However, when the first wafer cleaner 220 is moved in the direction B, as shown in FIG. 4 with respect to the second wafer cleaner 220', the users can access the third wafer relay device 280c, the wafer carrier assembly 260b and the polishing table 256b of the polishing station 20 in order to maintain them.

Similarly, when the second wafer cleaner 220' is moved in the direction B, as illustrated in FIG. 4, the users can access the third wafer relay device 280c', the wafer carrier assembly 260b' and the polishing table 256b of the polishing station 20 in order to maintain them. When the second wafer cleaner 220' is moved to the direction A, as shown in FIG. 4 with respect to the first wafer cleaner 220, the users can access the first and second wafer relay devices 280a' and 280b', the wafer carrier assembly 260a' and the polishing table 256a of the polishing station 20 in order to maintain them.

The wafer cleaner 220 is connected to a bottom housing 12 of the polishing apparatus 10 through the fluid conduit system 290, as illustrated in FIG. 5. Alternatively, instead of the bottom housing 12, the fluid conduit system 290 can connect the wafer cleaner 220 directly to a floor (not shown) of a facility where the polishing apparatus 10 is installed.

The fluid conduit system 290 can be used as a housing for multiple fluid channels 450 that supply D.I. water and chemicals such as D.I. water and HF from their respective sources (not shown) to the wafer cleaner 220 and drain used D.I. water and chemicals from the wafer cleaner 220 to their respective drains (not shown), as illustrated in FIG. 5. The fluid conduit system 290 is configured to be bendable such that the wafer cleaner 220 can move back and forth in a linear manner with respect to the polishing station 20 without disconnecting the fluid conduit system 290, as illustrated in FIGS. 1 and 4.

The fluid conduit system 290 comprises a first joint 300, a second joint 400, a floating joint 350, a first tube 325 and a second tube 375. The first joint 300 is mounted to the wafer cleaner 220. The second joint 400 is mounted to the bottom housing 12 of the polishing apparatus 10. Alternatively, the second joint 400 can be mounted to a floor of a facility where the polishing apparatus 10 is installed instead of the bottom housing 12. A first end 325a of the first tube 325 is connected to the first joint 300 such that the first tube 325 can pivot about the first joint 300. A second end 325b of the first tube 325 is connected to the floating joint 350 such that the first tube 325 can also pivot about the floating joint 350.

A first end 375a of the second tube 375 is connected to the second joint 400 such that the second tube 375 can pivot about the second joint 400. A second end 375b of the second tube 375 is connected to the floating joint 350 such that the second tube 375 can also pivot about the floating joint 350. As illustrated in FIGS. 1 and 4, free movement of the floating joint 350 relative to the first and second joints 300 and 400 and the pivoting motions of the first and second tubes 325 and 375 make it possible to move the wafer cleaner 220 in the linear manner without disconnecting the fluid conduit system 290.

Even though the fluid conduit system 290 is described to comprise one floating joint 350 and two tubes 325 and 375 connected to the floating joint 350, it is also possible to use any type of fluid conduit systems which can connect the first joint 300 and the second joint 400. Generally, fluid conduit systems that can be used in the polishing apparatus 10 comprise N floating joints and N+1 tubes, where N is an integer equal to or larger than 2, such that n'th floating joint is connected to n'th and n+1'th tubes, where n is an integer equal to or smaller than N. The first tube connects the first joint 300 and the first floating joint of the N floating joints. The last tube connects the second joint 400 and the last floating joint of the N floating joints.

In an embodiment, the lengths of the first and second tubes 325 and 375 and the locations of the first and second joints 300 and 400 are selected such that the floating joint 350 does not protrude from under the first wafer cleaner 220 when the fluid conduit system 290 bends due to a linear movement of the wafer cleaner 220.

Figure 6:
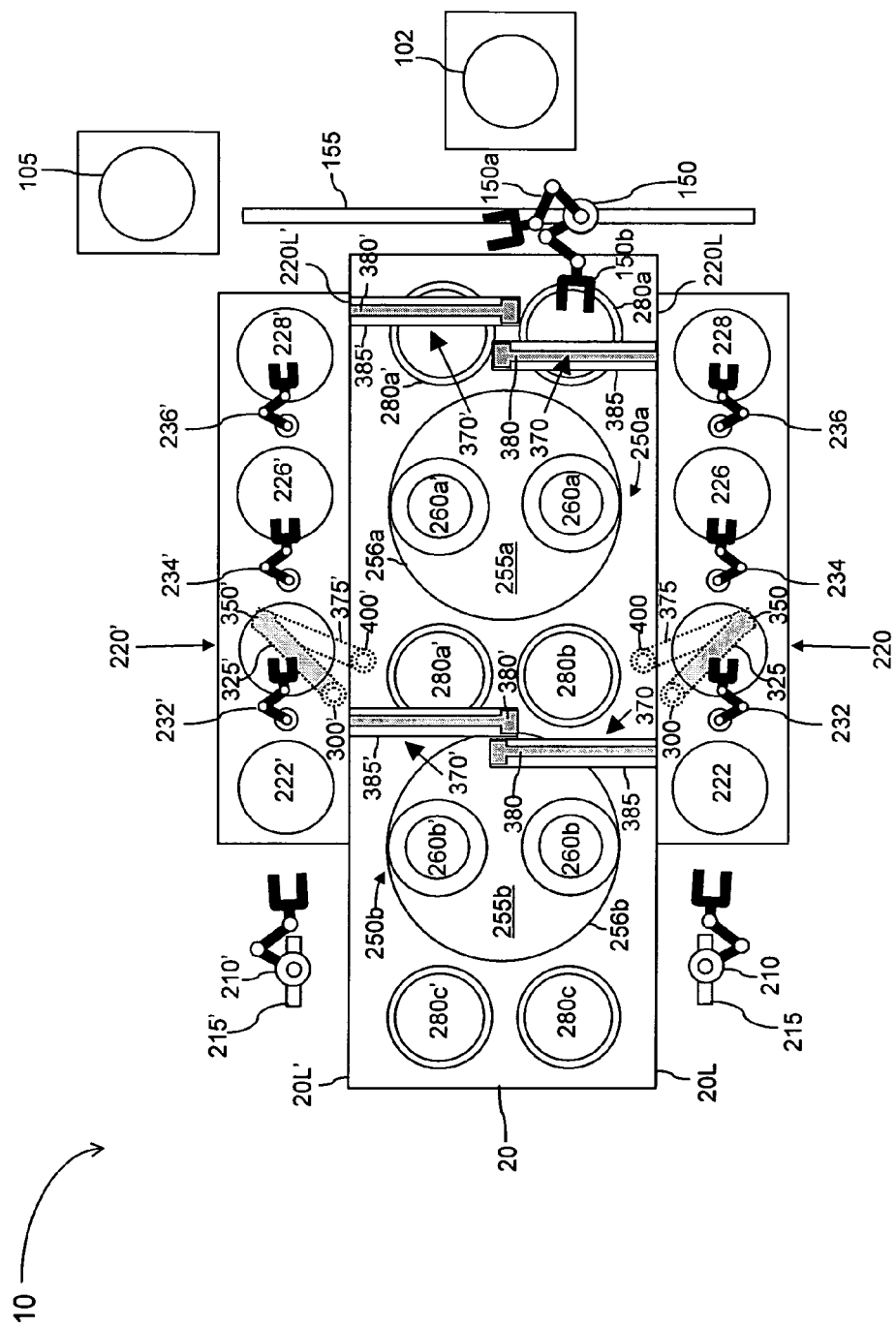
FIG. 6 is a top view of a polishing apparatus in accordance with an alternative embodiment of the present invention.
Figure 7:
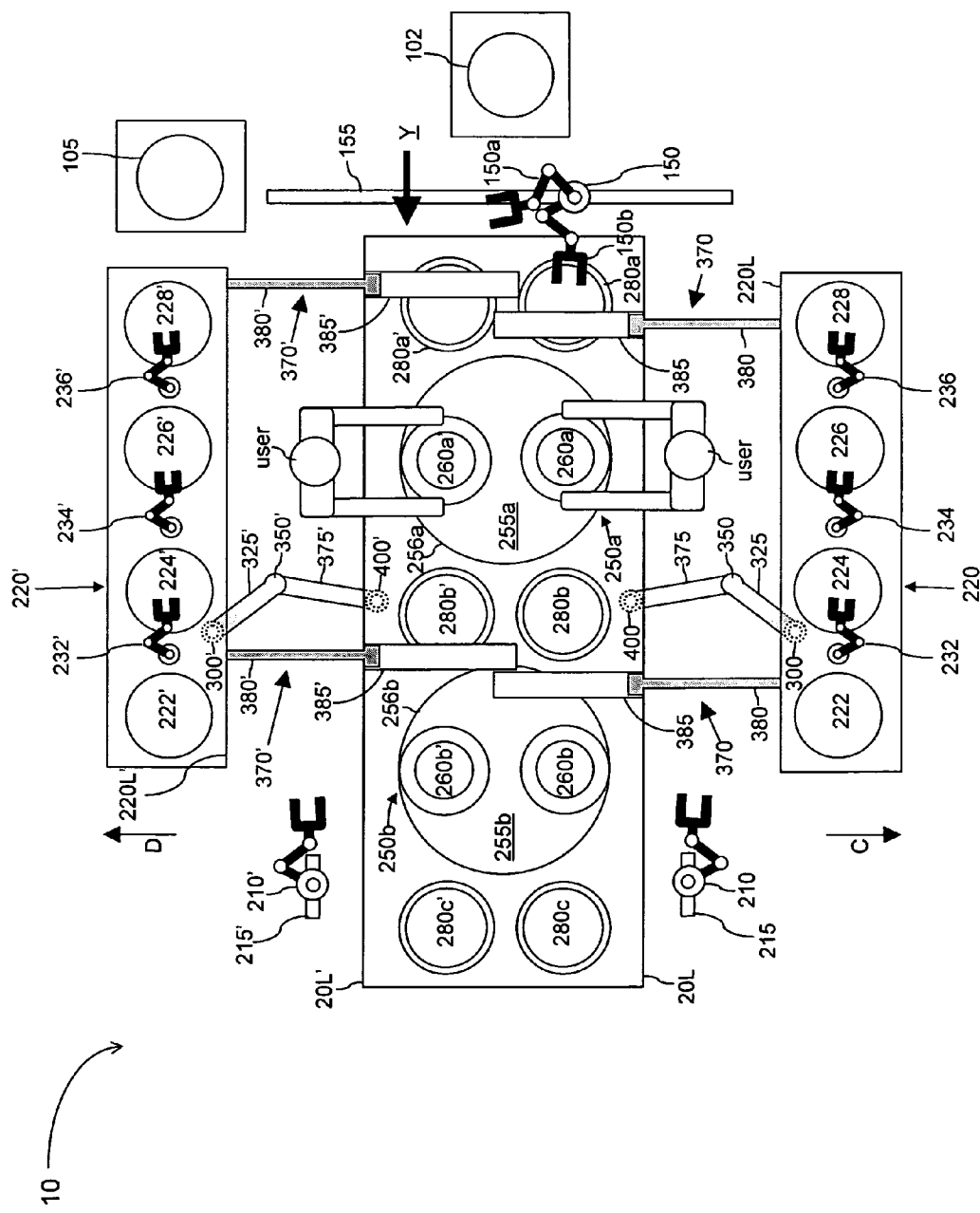
FIG. 7 is a top view of the polishing apparatus of FIG. 6, showing wafer cleaners at their respective maintenance positions.
Figure 8:
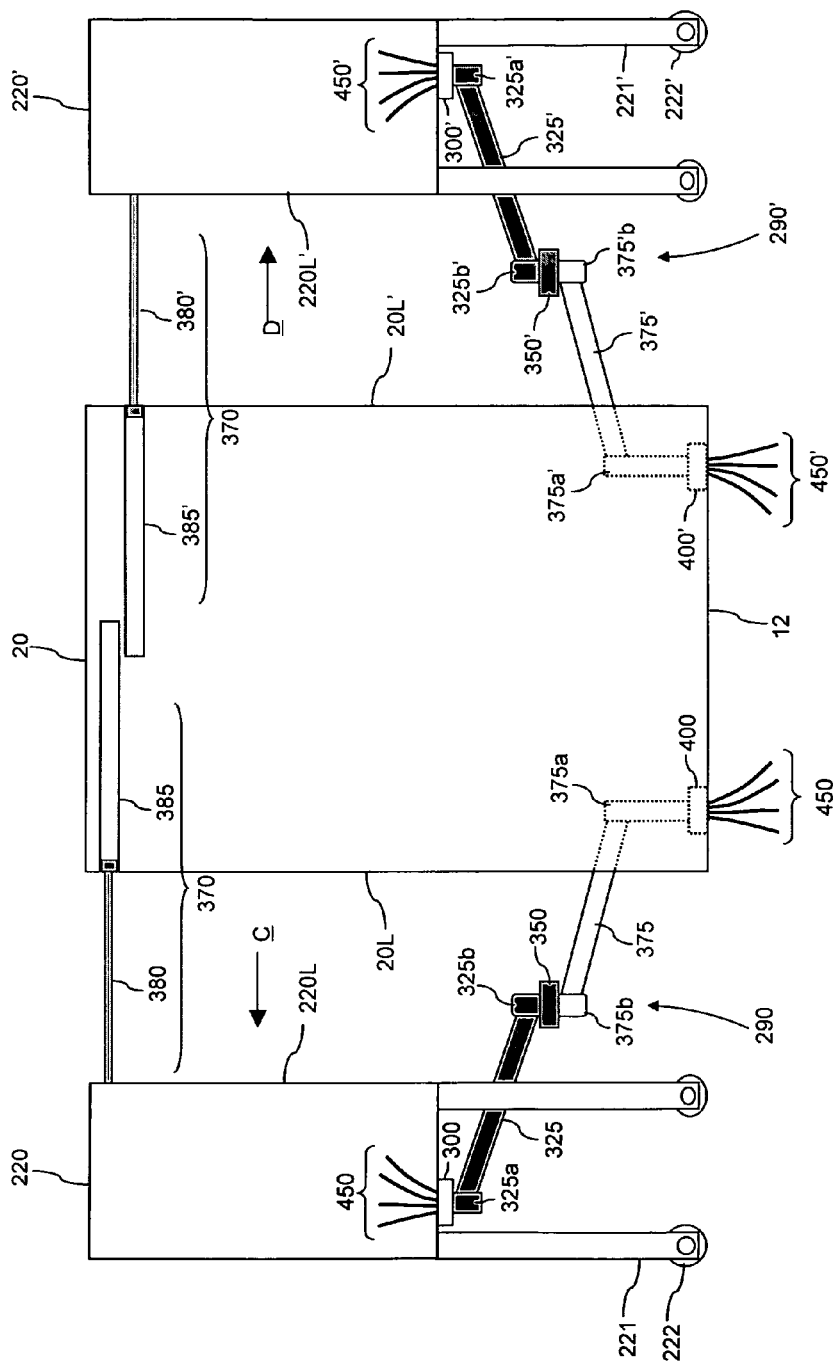
FIG. 8 is a side view of the polishing apparatus of FIG. 6, showing the wafer cleaners at their respective maintenance positions.

According to an alternative embodiment of the present invention, the linear guides 230 and 230' of the polishing apparatus 10 can be replaced with linear guide mechanisms 370 and 370', which are illustrated in FIGS. 6, 7 and 8, in order to move the wafer cleaners 220 and 220' to access components of the polishing station 20.

FIG. 6 is a top view of the polishing apparatus 10 comprising the linear guide mechanisms 370 and 370' with the wafer cleaners 220 and 220' located at their respective operational positions. FIG. 7 is another top view of the polishing apparatus 10 comprising the linear guide mechanisms 370 and 370' with the wafer cleaners 220 and 220' located at their respective maintenance positions. FIG. 8 is a side view of the wafer cleaners 220 and 220' (at their respective maintenance positions), the fluid conduit systems 290 and 290', and the polishing station 20 of the polishing apparatus 10 comprising the linear guide mechanisms 370 and 370', which are viewed from the direction Y in FIG. 7.

The polishing apparatus 10 of FIG. 6 is similar to the polishing apparatus 10 of FIG. 1 except that the wafer cleaners 220 and 220' are configured to move apart from the polishing station 20 in a linear manner using the linear guide mechanisms 370 and 370'. The wafer cleaner 220 is configured to be moved in the direction C away from the polishing station 20, as illustrated in FIGS. 7 and 8, using the two linear guide mechanisms 370, which are each attached to the polishing station 20 and the wafer cleaner 220. Thus, the space between the polishing station 20 and the wafer cleaner 220 is increased. Similarly, the wafer cleaner 220' is configured to be moved in the direction D away from the polishing station 20, as illustrated in FIGS. 7 and 8, using the two linear guide mechanisms 370', which are each attached to polishing station 20 and the wafer cleaner 220'. Thus, the space between the polishing station 20 and the wafer cleaner 220' is increased. The fluid conduit system 290 that was described with reference to FIGS. 1, 4 and 5 can be used in the polishing apparatus 10 of FIG. 6.

In this embodiment, the linear guide mechanisms 370 and 370' are identical. Thus, only one of the linear guide mechanisms 370 and 370' is described in detail. The linear guide mechanism 370 comprises an elongate male portion 380 and an elongate female portion 385. The female portion 385 is mounted to the polishing station 20 such that it receives the male portion 380. A first end of the male portion 380 is connected to the wafer cleaner 220 and a second end of the male portion 380 is inserted in the female portion 385. When the wafer cleaner 220 is moved apart from the polishing station 20, the male portion 380 is pulled out from the female portion 385, which extends the linear guide mechanism 370, as illustrated in FIGS. 7 and 8. Thus, the linear guide mechanisms 370 and 370' are used to linearly move the wafer cleaners 220 and 220' to their respective predetermined positions.

Users can access the polishing units 250 and the wafer relay devices 280 of the polishing station 20 either from the space between the moved first wafer cleaner 220 and the longer side 20L of the polishing station 20 or the space between the moved second wafer cleaner 220' and the longer side 20L' of the polishing station 20 in order to maintain the wafer relay devices 280 and the polishing units 250, as illustrated in FIG. 7.

Figure 9:
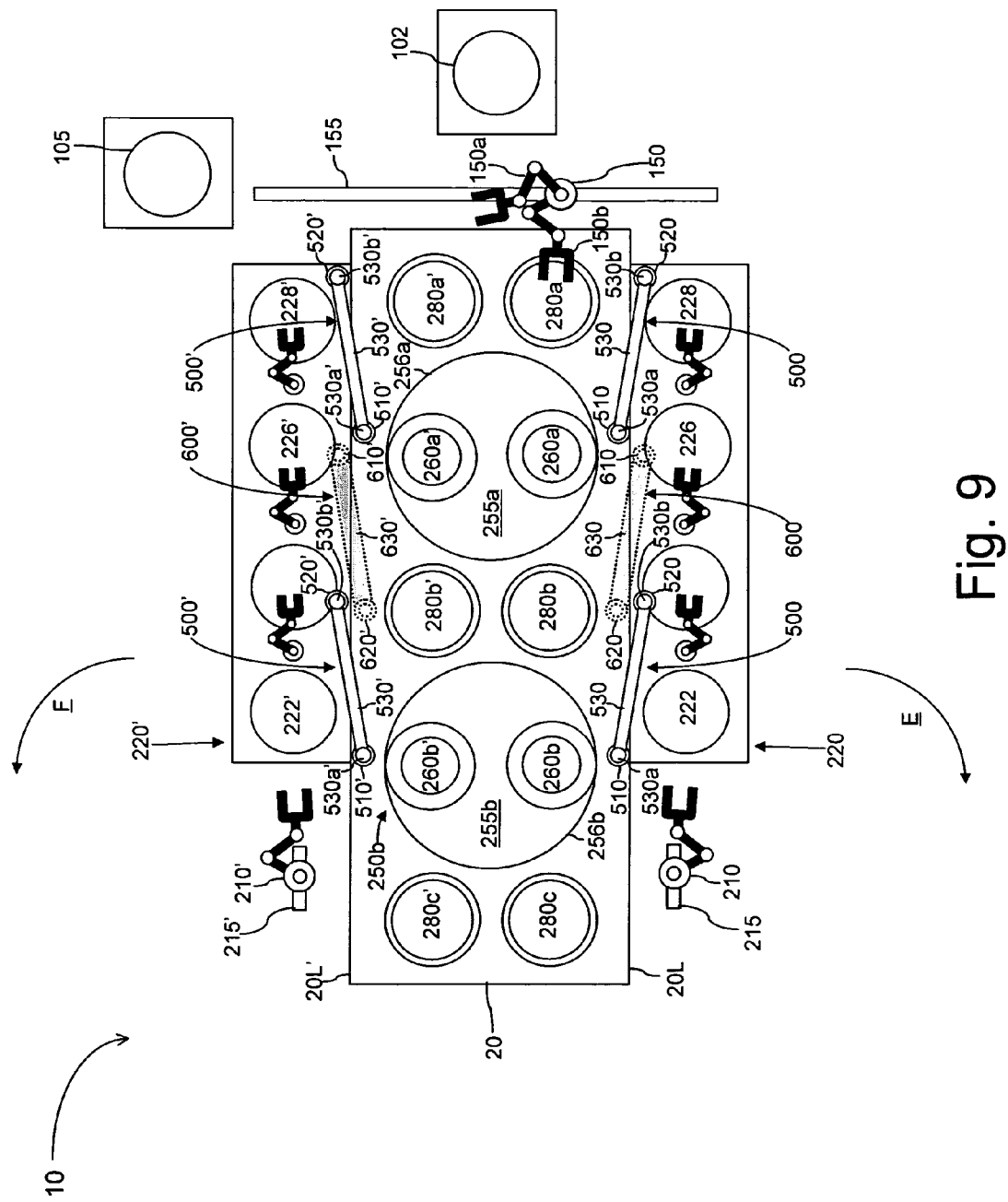
FIG. 9 is a top view of a polishing apparatus in accordance with another alternative embodiment of the present invention.
Figure 10:
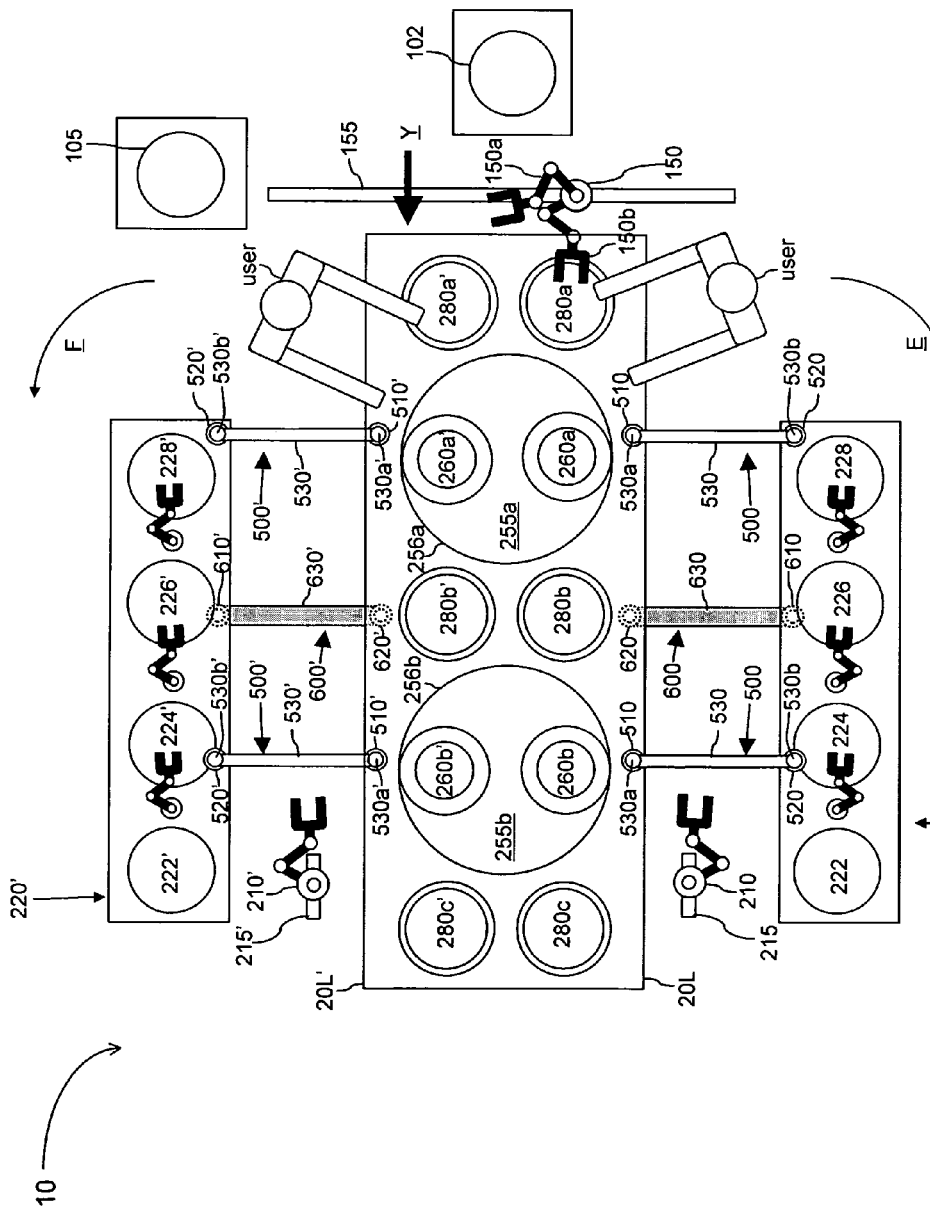
FIG. 10 is a top view of the polishing apparatus of FIG. 9, showing wafer cleaners at their respective maintenance positions.
Figure 11:
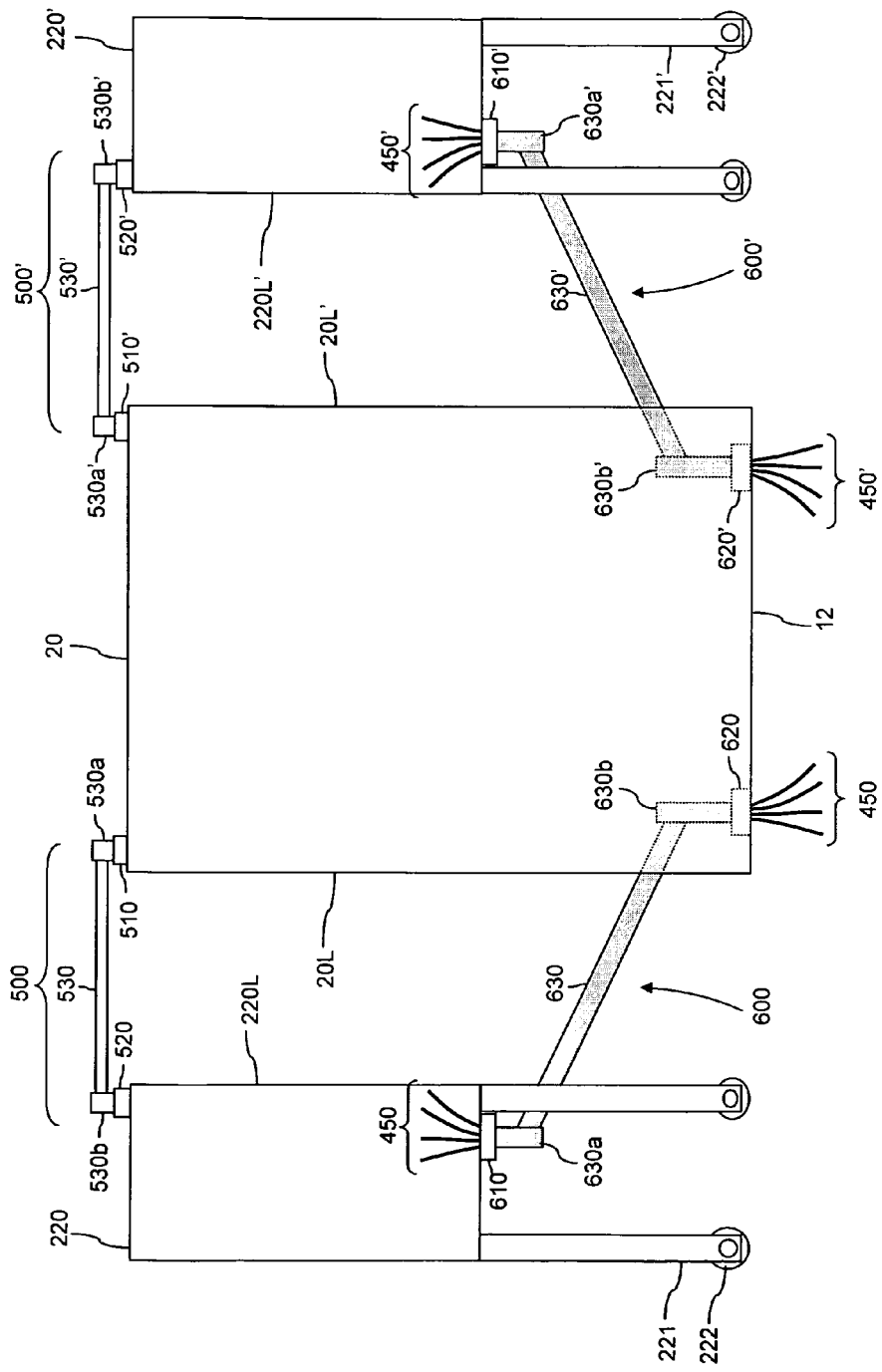
FIG. 11 is a side view of the polishing apparatus of FIG. 9, showing the wafer cleaners at their respective maintenance positions.

According to another alternative embodiment of the present invention, the linear guides 230 and 230' of the polishing apparatus 10 of FIG. 1 can be replaced with pivoting guide mechanisms 500 and 500', illustrated in FIGS. 9, 10 and 11, in order to move the wafer cleaners 220 and 220' to access components of the polishing station 20.

FIG. 9 is a top view of the polishing apparatus 10 comprising the pivoting guide mechanisms 500 and 500' with the wafer cleaners 220 and 220' located at their respective operational positions. FIG. 10 is a top view of the polishing apparatus 10 comprising the pivoting guide mechanisms 500 and 500' with the wafer cleaners 220 and 220' located at their respective maintenance positions. FIG. 11 is a side view of the wafer cleaners 220 and 220' (at their respective maintenance positions), fluid conduit systems 600 and 600' (described below), and the polishing station 20 of the polishing apparatus 10 comprising the pivoting guide mechanisms 500 and 500', which are viewed from the direction Y in FIG. 10.

The polishing apparatus 10 of FIG. 9 is similar to the polishing apparatus 10 of FIG. 1 except that the wafer cleaners 220 and 220' are configured to move apart from the polishing station 20 in a pivoting manner using the pivoting guide mechanisms 500 and 500'. The wafer cleaner 220 is configured to be pivoted in the direction E away from the polishing station 20, as illustrated in FIGS. 10 and 11, using the two pivoting guide mechanisms 500, which are each attached to polishing station 20 and the wafer cleaner 220. Similarly, the wafer cleaner 220' is configured to be pivoted in the direction F away from the polishing station 20, as illustrated in FIGS. 10 and 11, using the two pivoting guide mechanisms 500', which are each attached to polishing station 20 and the wafer cleaner 220'.

In this embodiment, the pivoting guide mechanisms 500 and 500' are identical. Thus, only one of the pivoting guide mechanisms 500 and 500' is described in detail. The pivoting guide mechanism 500 comprises a first joint 510, a second joint 520 and a shaft 530. The first joint 510 is mounted to the polishing station 20 and the second joint 520 is mounted to the wafer cleaner 220, as best shown in FIG. 11. A first end 530a of the shaft 530 is connected to the first joint 510 such that the shaft 530 can pivot about the first joint 510. A second end 530b of the shaft 530 is connected to the second joint 520 such that the shaft 530 can pivot about the second joint 520. As illustrated with the arrow E in FIG. 10, the shaft 530 pivots about the joints 510 and 520 when the wafer cleaner 220 is moved away from the polishing station 20. The pivoting guide mechanism 500' operates in a similar fashion to move the wafer cleaner 220' apart from the polishing station 20, as illustrated with the arrow F in FIG. 10. Thus, the pivoting guide mechanisms 500 and 500' are used to move the wafer cleaners 220 and 220' to their respective predetermined positions.

In the polishing apparatus 10 of FIG. 9 comprising the pivoting guide mechanisms 500 and 500', the fluid conduit systems 600 and 600' can be used instead of the fluid conduit systems 290 and 290', which were described above with reference to FIGS. 1, 4 and 5. In this embodiment, the fluid conduit systems 600 and 600' are identical. Thus, only one of the fluid conduit systems 600 and 600' is described in detail. The fluid conduit system 600 comprises a first joint 610, a second joint 620 and a tube 630. The first joint 610 is mounted to the wafer cleaner 220. The second joint 620 is mounted to the bottom housing 12 of the polishing apparatus 10. Alternatively, the second joint 620 can be mounted to a floor of a facility where the polishing apparatus 10 is installed instead of the bottom housing 12. As best shown in FIG. 11, a first end 630a of the first tube 630 is connected to the first joint 610 such that the tube 630 can pivot about the first joint 610. A second end 630b of the tube 630 is connected to the second joint 620 such that the tube 630 can also pivot about the second joint 620. As illustrated with the arrow E in FIG. 10, the tube 630 can pivot about the first joint 610 and the second joint 620 when the wafer cleaners 220 is pivoted away from the polishing station 20. The fluid conduit system 600' operates in a similar fashion when the wafer cleaner 220' is pivoted away from the polishing station 20, as illustrated with the arrow F in FIG. 10.

Users can access the polishing units 250 and the wafer relay devices 280 of the polishing station 20 either from the space between the pivoted first wafer cleaner 220 and the longer side 20L of the polishing station 20 or the space between the pivoted second wafer cleaner 220' and the longer side 20L' of the polishing station 20 in order to maintain the wafer relay devices 280 and the polishing units 250, as illustrated in FIG. 10.

In the polishing apparatus 10, the wafer cleaners 220 and 220' can be moved manually by the users or automatically using pneumatic or mechanical force. Conventional ancillary devices (not shown) can be used to transfer the pneumatic or mechanical force, which may be generated by a suitable mechanism, such as pumps or motors, to the wafer cleaners 220 and 220' in order to move the wafer cleaners.

Figure 12:
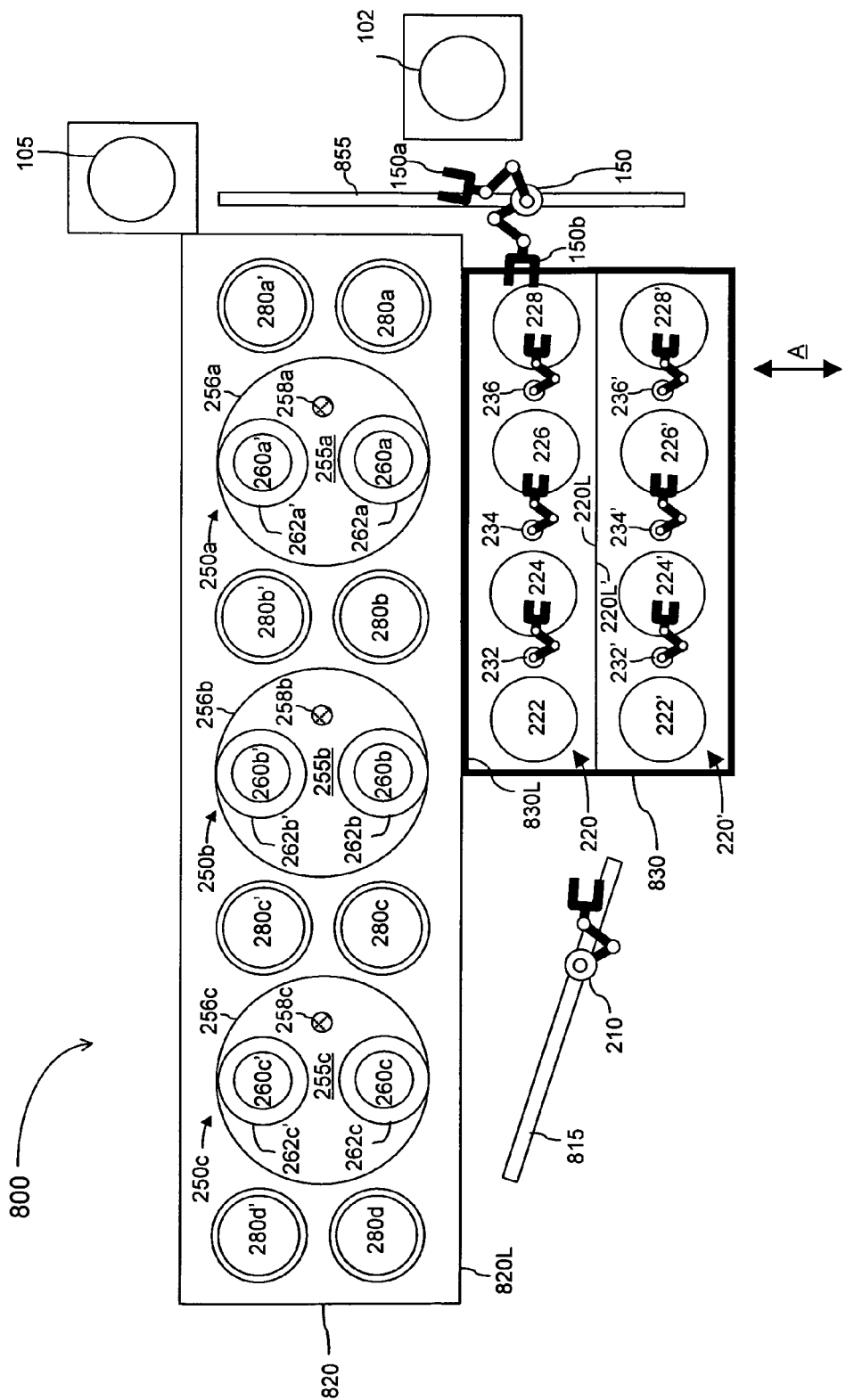
FIG. 12 is a top view of a polishing apparatus in accordance with another embodiment of the present invention.

Turning now to FIG. 12, a polishing apparatus 800 in accordance with another embodiment of the present invention is described. The polishing apparatus 800 includes some of the components of the polishing apparatus 10 of FIG. 1. Thus, the reference numbers used in FIG. 1 will be used in FIG. 12 to identify common components. The polishing apparatus 800 comprises a polishing station 820, the wafer storage station 102, the optional buffer station 105, the first wafer transport device 150, the second wafer transport device 210, and a wafer cleaning system 830.

The polishing station 820 is similar to the polishing station 20 of the polishing apparatus 10. The polishing station 820 is an enclosed structure with window-like mechanisms (not shown) that can be opened to transfer semiconductor wafers into and out of the polishing station 820. As illustrated in FIG. 12, the polishing station 820 in this embodiment is rectangular in shape with two longer sides and two shorter sides. The polishing station 820 comprises the polishing units 250a and 250b, the first two wafer relay devices 280a and 280a', the second two wafer relay devices 280b and 280b', and the third two wafer relay devices 280c and 280c'. However, the polishing station 820 further comprises a third polishing unit 250c and fourth two wafer relay devices 280d and 280d'. The third polishing unit 250c is structurally similar to the polishing units 250a and 250b. Thus, the polishing unit 250c comprises a polishing table 256c, a first wafer carrier assembly 260c and a second wafer carrier assembly 260c'. Each of the wafer carrier assemblies 260c and 260c' comprises a wafer carrier 262, a carrier shaft 264 and a rotational-and-vertical drive mechanism 266, as illustrated in FIGS. 2 and 3.

In the polishing station 820, the third polishing unit 250c is positioned next to the third wafer relay devices 280c and 280c' such that wafers can be transferred from the third wafer relay devices 280c and 280c' to the wafer carriers 262c and 262c' of the third polishing unit 250c, respectively. The fourth wafer relay devices 280d and 280d' are positioned next to the third polishing unit 250c such that wafers that were polished at the third polishing unit 150c can be transferred from the wafer carriers 262c and 262c' of the third polishing unit 250c to the fourth wafer relay devices 280d and 280d', respectively.

The wafer cleaning system 830 comprises the first wafer cleaner 220 and the second wafer cleaner 220', which are attached to each other. In order to minimize the width of the polishing apparatus 800, the wafer cleaners 220 and 220' are preferably positioned such that the longer side 220L of the first wafer cleaner 220 is facing to the longer side 220L' of the second wafer cleaner 220, as illustrated in FIG. 12. As a result, the wafer cleaning system 830 in this embodiment is also rectangular in shape with two longer sides and two shorter sides. The wafer cleaning system 830 is positioned such that the longer side 830L of the wafer cleaning system 800 is facing the longer side 820L of the polishing station 820, as illustrated in FIG. 12. The area of the polishing station 820 is an area roughly defined by the polishing tables 256a, 256b and 256c.

The first wafer transport device 150 is situated on a linear track 855, which allows the first wafer transport device 150 to access the wafer storage station 102, the buffer station 105, the first wafer relay devices 280a and 280a' of the polishing station 820 and the drying stations 228 and 228' of the first and second wafer cleaners 220 and 220'. Thus, the first wafer transport device 150 can transfer wafers between the wafer storage station 102, the buffer station, the first wafer relay devices 280a and 280a' of the polishing station 820 and the drying stations 228 and 228' of the first and second wafer cleaners 220 and 220'.

The second wafer transport device 210 is situated on a linear track 815, which allows the second wafer transport device 210 to access the wafer receiving stations 222 and 222' of the first and second wafer cleaners 220 and 220' and the third wafer relay devices 280c and 280c' and the fourth wafer relay devices 280d and 280d' of the polishing station 820. The second wafer transport device 210 transfers wafers from the polishing station 820 to the first and second wafer cleaners 220 and 220' of the wafer cleaning system 830. More specifically, the second wafer transport device 210 transfers wafers from the fourth wafer relay devices 280d and 280d' of the polishing station 820 to the wafer receiving stations 222 and 222' of the first and second wafer cleaners 220 and 220'. The second wafer transport device 210 can also transfer wafers from the third wafer relay devices 280c and 280c' of the polishing station 820 to the wafer receiving stations 222 and 222' of the first and second wafer cleaners 220 and 220'.

In an alternative embodiment of the present invention, the first two wafer relay devices 280*a* and 280*a'* of the polishing station 820 in the polishing apparatus 800 of FIG. 12 can be removed. In this embodiment, the first wafer transport device 150 transfers wafers directly to the wafer carriers 262*a* and 262*a'* of the first polishing unit 250*a*.

In another alternative embodiment of the present invention, the fourth two wafer relay devices 280*d* and 280*d'* of the polishing station 820 in the polishing apparatus 800 of FIG. 12 can be removed. In this embodiment, the second wafer transport device 210 transfers wafers directly from the wafer carriers 262*c* and 262*c'* of the third polishing unit 250*c* to the first and second wafer cleaners 220 and 220'.

In another alternative embodiment of the present invention, the first and fourth wafer relay devices 280*a*, 280*a'*, 280*d* and 280*d'* of the polishing station 820 in the polishing apparatus 820 of FIG. 12 can be removed. In this embodiment, the first wafer transport device 150 transfers wafers directly to the wafer carriers 262*a* and 262*a'* of the first polishing unit 250*a*. The second wafer transport device 210 transfers wafers directly from the wafer carriers 262*c* and 262*c'* of the third polishing unit 250*c* to the first and second wafer cleaners 220 and 220'.

Methods of processing wafers in the polishing apparatus 800 of FIG. 12 in accordance with an embodiment of the invention is similar to the methods of processing wafers in the polishing apparatus 10 of FIG. 1, as described above, except that the wafers can be further polished at the third polishing unit 250*c* and the wafers are transferred from the fourth wafer relay devices 280*d* and 280*d'* or the wafer carriers 262*c* and 262*c'* of the third polishing unit 250*c* to the first and second wafer cleaners 220 and 220'.

Similar to the wafer cleaners 220 and 220' of the polishing apparatus 10 of FIGS. 1, 6 and 9, the wafer cleaning system 830 of the polishing apparatus 800 is also movable so that users can access the interface between the polishing station 820 and the wafer cleaning system 830. In order to facilitate this movement of the wafer cleaning system 830, the polishing apparatus 800 includes one or more guide mechanisms (not shown in FIG. 12) to allow the wafer cleaning system 830 to be moved. As an example, the polishing apparatus 800 may include linear guide mechanisms 370, as illustrated in FIGS. 6-8, which are connected to the polishing station 820 and the wafer cleaning system 830 so that the wafer cleaning system 830 can be linearly displaced along a direction orthogonal to the longer side 820L of the polishing station 820 using the linear guide mechanisms 370, as illustrated in FIG. 12 with the arrow A. As another example, the polishing apparatus 800 may include the pivoting guide mechanisms 500, as illustrated in FIGS. 9-11, which are connected to the polishing station 820 and the wafer cleaning system 830 so that the wafer cleaning system 830 can be pivoted away from the polishing station 820 and then pivoted back to the polishing station 820.

When users need to access the interface between the polishing station 820 and the wafer cleaning system 830, the wafer cleaning system 830 is moved away from the polishing station 820, as illustrated in FIG. 12 with the arrow A. After the wafer cleaning system 300 is moved away from the polishing station 820, users can access the first and second wafer relay devices 280*a* and 280*b*, the wafer carrier assembly 260*a* and the polishing table 256*a* of the polishing station 820 in order to maintain them. Users can also access the wafer cleaning system 830 from the side 830L facing the polishing station 20 in order to maintain the wafer cleaning system 830.

After maintaining them, the wafer cleaning system 830 can be moved back to its original operational position such that the second wafer transport device 210 can transfer wafers to the wafer cleaning station 830.

The polishing apparatus 800 can be modified to comprise the polishing station 20, as illustrated in FIG. 1, instead of the polishing station 820. In this embodiment, the second wafer transport device 210 transfers wafers directly from the third wafer relay devices 280*c* and 280*c'* to the first and second wafer cleaners 220 and 220'. If the polishing station 20 does not include the third wafer relay devices 280*c* and 280*c'*, then the second wafer transport device 210 transfers wafers directly from the wafer carriers 262*b* and 262*b'* of the second polishing unit 250*b* to the first and second wafer cleaners 220 and 220'.

Similarly, the polishing apparatus 10 can be modified to comprise the polishing station 820, as illustrated in FIG. 12, instead of the polishing station 20. In fact, the polishing apparatuses 10 and 800 can be modified to comprise a polishing station having any number of polishing units 250 and any number of wafer relay devices 280.

Figure 13:
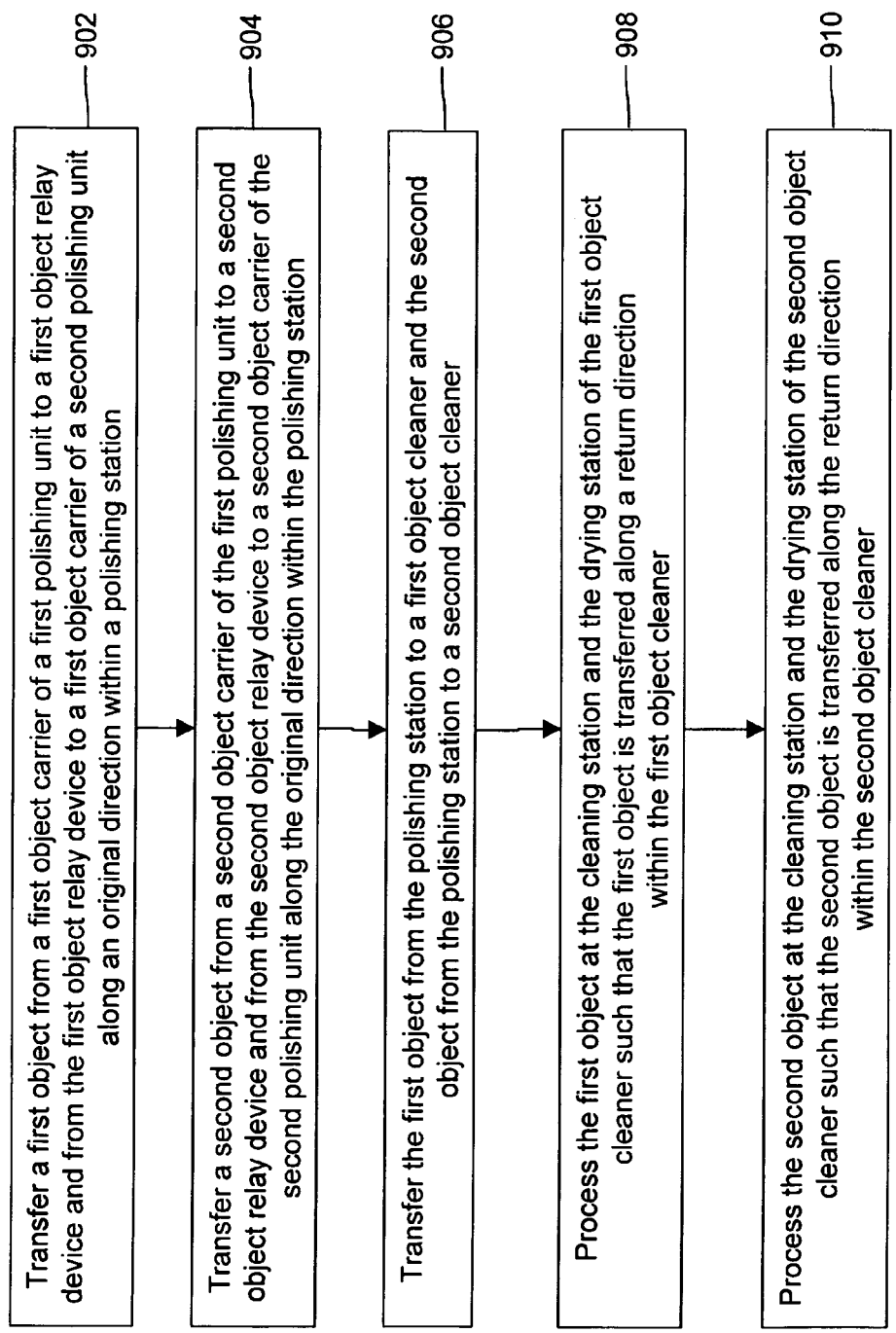
FIG. 13 is a flow diagram of a method for polishing objects, such as semiconductor wafers, in accordance with an embodiment of the present invention.

A method of polishing objects, such as semiconductor wafers, in accordance with an embodiment of the invention is described with reference to a flow diagram of FIG. 13. At block 902, a first object is transferred from a first object carrier of a first polishing unit to a first object relay device and from the first object relay device to a first object carrier of a second polishing unit along an original direction within a polishing station. In addition, at block 902, the first object is polished at the first and second polishing units. At block 904, a second object is transferred from a second object carrier of the first polishing unit to a second object relay device and from the second object relay device to a second object carrier of the second polishing unit along the original direction within the polishing station. In addition, at block 904, the second object is polished at the first and second polishing units. At block 906, the first object is transferred from the polishing station to a first object cleaner and the second object is transferred from the polishing station to a second object cleaner. Each of the first and second object cleaners includes a cleaning station and a drying station. At block 908, the first object is processed at the cleaning station and the drying station of the first object cleaner such that the first object is transferred along a return direction within the first object cleaner. The return direction is the opposite direction of the original direction. At block 910, the second object is processed at the cleaning station and the drying station of the second object cleaner such that the second object is transferred along the return direction within the second object cleaner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An apparatus for polishing objects, said apparatus comprising:
   a polishing station including at least one polishing unit to polish said objects;
   a movable object cleaner positioned adjacent to a side of said polishing station, said movable object cleaner including a cleaning station and a drying station;
   an object transport device positioned to transfer said objects from said polishing station to said movable object cleaner;

a guide mechanism operatively connected to said polishing station and said movable object cleaner, said guide mechanism being configured to allow said movable object cleaner to be displaced from an initial position to a subsequent position to provide access to parts of said polishing station, said guide mechanism further being configured to allow said movable object cleaner to be displaced back to said initial position from said subsequent position;

a fluid conduit system mounted to said movable object cleaner and one of said polishing station and a floor, said fluid conduit system including first and second tubes that are connected to bend or pivot when said movable object cleaner is displaced.

2. The apparatus of claim 1 wherein said guide mechanism includes a linear guide mechanism attached to said polishing station and said movable object cleaner, said linear guide mechanism being configured to be extended to allow said movable object cleaner to be displaced such that a space between said polishing station and said movable object cleaner is increased.

3. The apparatus of claim 2 wherein said linear guide mechanism includes an elongate female portion and an elongate male portion that is inserted into said elongate female portion, said elongate male portion being able to be partially pulled out of said female portion such that said linear guide mechanism is extended.

4. The apparatus of claim 1 further comprising:
a second movable object cleaner positioned adjacent to another side of said polishing station; and
a second guide mechanism operatively connected to said polishing station and said second movable object cleaner, said second guide mechanism being configured to allow said second movable object cleaner to be displaced from another initial position to another subsequent position to provide access to other parts of said polishing station, said second guide mechanism further being configured to allow said second movable object cleaner to be displaced back to said another initial position from said another subsequent position.

5. The apparatus of claim 1 further comprising a storage station and another object transport device, said another object transport device being positioned to transfer said objects between said storage station and said polishing station.

6. The apparatus of claim 1 wherein said polishing station is rectangular in shape with two longer sides and two shorter sides, said movable object cleaner being positioned adjacent to one of said two longer sides of said polishing station.

7. The apparatus of claim 6 wherein said movable object cleaner is rectangular in shape with two longer sides and two shorter sides, said movable object cleaner being positioned adjacent to said polishing station such that one of said longer sides of said polishing station is facing one of said longer sides of said movable object cleaner.

8. The apparatus of claim 1 wherein said movable object cleaner further includes at least one object transfer device to transfer said objects from said cleaning station to said drying station.

9. An apparatus for polishing objects, said apparatus comprising:
a polishing station including a plurality of polishing units to polish said objects and at least one object relay device to transfer said objects between said polishing units, said polishing station being rectangular in shape with two longer sides and two shorter sides;

a movable object cleaner positioned adjacent to one of said two longer sides of said polishing station, said movable object cleaner including a cleaning station and a drying station;

an object transport device positioned to transfer said objects from said polishing station to said movable object cleaner;

a guide mechanism operatively connected to said polishing station and said movable object cleaner, said guide mechanism being configured to allow said movable object cleaner to be displaced from an operational position to a maintenance position to provide access to parts of said polishing station, said guide mechanism further being configured to allow said movable object cleaner to be displaced back to said operational position from said maintenance position; and a fluid conduit system mounted to said movable object cleaner and one of said polishing station and a floor, said fluid conduit system including first and second tubes that are connected to bend or pivot when said movable object cleaner is displaced.

10. The apparatus of claim 9 wherein said guide mechanism includes a linear guide mechanism attached to said polishing station and said movable object cleaner, said linear guide mechanism being configured to be extended to allow said movable object cleaner to be displaced such that a space between said polishing station and said movable object cleaner is increased.

11. The apparatus of claim 10 wherein said linear guide mechanism includes an elongate female portion and an elongate male portion that is inserted into said elongate female portion, said elongate male portion being able to be partially pulled out of said female portion such that said linear guide mechanism is extended.

12. The apparatus of claim 9 further comprising:
a second movable object cleaner positioned adjacent to the other longer side of said polishing station; and
a second guide mechanism operatively connected to said polishing station and said second movable object cleaner, said second guide mechanism being configured to allow said second movable object cleaner to be displaced from another operational position to another maintenance position to provide access to other parts of said polishing station, said second guide mechanism further being configured to allow said second movable object cleaner to be displaced back to said another operational position from said another maintenance position.

13. The apparatus of claim 9 wherein said movable object cleaner is rectangular in shape with two longer sides and two shorter sides, said movable object cleaner being position adjacent to said polishing station such that said one of said longer sides of said polishing station is facing one of said longer sides of said movable object cleaner.

14. The apparatus of claim 9 wherein said movable object cleaner further includes at least one object transfer device to transfer said objects from said cleaning station to said drying station.

15. An apparatus for polishing objects, said apparatus comprising:
a polishing station comprising:
first and second polishing units, each of said first and second polishing units including a polishing table and first and second object carriers; and
first and second object relay devices positioned between said first polishing unit and said second polishing unit, said first object relay device being positioned to transfer a first object from said first object carrier of said first polishing unit to said first object carrier of said second polishing unit along an original direction, said second object relay device being positioned to transfer a second object from said second object carrier of said first polishing unit to said second object carrier of said second polishing unit along said original direction;

first and second object cleaners positioned near said polishing station, each of said first and second object cleaners including a cleaning station and a drying station, said first object cleaner being configured to process said first object at said cleaning station and said drying station of said first object cleaner such that said first object is transferred within said first object cleaner along a return direction, said second object cleaner being configured to process said second object at said cleaning station and said drying station of said second object cleaner such that said second object is transferred along said return direction within said second object cleaner, said return direction being the opposite direction of said original direction; and at least one object transport device positioned to transfer said first object from said polishing station to said first object cleaner and to transfer said second object from said polishing station to said second object cleaner.

16. The apparatus of claim 15 wherein said at least one object transport device includes a first object transport device and a second object transport device, said first object transport device being positioned to transfer said first object from said polishing station to said first object cleaner, said second object transport device being positioned to transfer said second object from said polishing station to said second object cleaner.

17. The apparatus of claim 15 wherein said first object cleaner is positioned adjacent to a first side of said polishing station and wherein said second object cleaner is positioned adjacent to a second side of said polishing station, said first and second sides being opposite sides of said polishing station.

18. The apparatus of claim 15 wherein said first object cleaner is positioned adjacent to a first side of said polishing station and wherein said second object cleaner is attached to said first object cleaner.

19. The apparatus of claim 15 further comprising a guide mechanism operatively connected to said polishing station and said first object cleaner, said guide mechanism being configured to allow said first second object cleaner to be displaced from an initial position to a subsequent position to provide access to parts of said polishing station, said guide mechanism further being configured to allow said first object cleaner to be displaced back to said initial position from said subsequent position.

20. The apparatus of claim 15 wherein said polishing station further comprises third and fourth object relay devices positioned adjacent to said first polishing unit such that said first polishing unit is situated between said first and second object relay devices and said third and fourth object relay devices, said third object relay device being positioned to transfer said first object to said first object carrier of said first polishing unit along said original direction, said fourth object relay device being positioned to transfer said second object to said second object carrier of said first polishing unit along said original direction.

21. The apparatus of claim 15 wherein said polishing station further comprises third and fourth object relay devices positioned adjacent to said second polishing unit such that said second polishing unit is situated between said first and second object relay devices and said third and fourth object relay devices, said third object relay device being positioned to transfer said first object from first object carrier of said second polishing unit along said original direction, said fourth object relay device being positioned to transfer said second object from said second object carrier of said second polishing unit along said original direction.

22. The apparatus of claim 15 further comprising a buffer station positioned near said polishing station, said buffer station being used to transfer said first and second objects to said polishing station.

23. The apparatus of claim 15 wherein each of said first and second object cleaner further includes at least one object transfer device to transfer one of said first and second objects from said cleaning station to said drying station.

24. An apparatus for polishing objects, said apparatus comprising:

a polishing station including at least one polishing unit to polish said objects;

a movable object cleaner positioned adjacent to a side of said polishing station, said movable object cleaner including a cleaning station and a drying station;

an object transport device positioned to transfer said objects from said polishing station to said movable object cleaner; and a guide mechanism operatively connected to said polishing station and said movable object cleaner, said guide mechanism being configured to allow said movable object cleaner to be displaced from an initial position to a subsequent position to provide access to parts of said polishing station, said guide mechanism further being configured to allow said movable object cleaner to be displaced back to said initial position from said subsequent position, wherein said guide mechanism includes a linear guide mechanism attached to said polishing station and said movable object cleaner, said linear guide mechanism being configured to be extended to allow said movable object cleaner to be displaced such that a space between said polishing station and said movable object cleaner is increased.

25. The apparatus of claim 24 wherein said linear guide mechanism includes an elongate female portion and an elongate male portion that is inserted into said elongate female portion, said elongate male portion being able to be partially pulled out of said female portion such that said linear guide mechanism is extended.

26. An apparatus for polishing objects, said apparatus comprising:

a polishing station including at least one polishing unit to polish said objects;

a movable object cleaner positioned adjacent to a side of said polishing station, said movable object cleaner including a cleaning station and a drying station;

an object transport device positioned to transfer said objects from said polishing station to said movable object cleaner;

a guide mechanism operatively connected to said polishing station and said movable object cleaner, said guide mechanism being configured to allow said movable object cleaner to be displaced from an initial position to a subsequent position to provide access to parts of said polishing station, said guide mechanism further being configured to allow said movable object cleaner to be displaced back to said initial position from said subsequent position;

a second movable object cleaner positioned adjacent to another side of said polishing station; and a second guide mechanism operatively connected to said polishing station and said second movable object cleaner, said second guide mechanism being configured to allow said second movable object cleaner to be displaced from another initial position to another subsequent position to provide access to other parts of said polishing station, said second guide mechanism further being configured to allow said second movable object cleaner to be displaced back to said another initial position from said another subsequent position.

27. An apparatus for polishing objects, said apparatus comprising:

a polishing station including a plurality of polishing units to polish said objects and at least one object relay device to transfer said objects between said polishing units, said polishing station being rectangular in shape with two longer sides and two shorter sides;

a movable object cleaner positioned adjacent to one of said two longer sides of said polishing station, said movable object cleaner including a cleaning station and a drying station;

an object transport device positioned to transfer said objects from said polishing station to said movable object cleaner; and a guide mechanism operatively connected to said polishing station and said movable object cleaner, said guide mechanism being configured to allow said movable object cleaner to be displaced from an operational position to a maintenance position to provide access to parts of said polishing station, said guide mechanism further being configured to allow said movable object cleaner to be displaced back to said operational position from said maintenance position, wherein said guide mechanism includes a linear guide mechanism attached to said polishing station and said movable object cleaner, said linear guide mechanism being configured to be extended to allow said movable object cleaner to be displaced such that a space between said polishing station and said movable object cleaner is increased.

28. The apparatus of claim 27 wherein said linear guide mechanism includes an elongate female portion and an elongate male portion that is inserted into said elongate female portion, said elongate male portion being able to be partially pulled out of said female portion such that said linear guide mechanism is extended.

29. An apparatus for polishing objects, said apparatus comprising:

a polishing station including a plurality of polishing units to polish said objects and at least one object relay device to transfer said objects between said polishing units, said polishing station being rectangular in shape with two longer sides and two shorter sides;

a movable object cleaner positioned adjacent to one of said two longer sides of said polishing station, said movable object cleaner including a cleaning station and a drying station;

an object transport device positioned to transfer said objects from said polishing station to said movable object cleaner;

a guide mechanism operatively connected to said polishing station and said movable object cleaner, said guide mechanism being configured to allow said movable object cleaner to be displaced from an operational position to a maintenance position to provide access to parts of said polishing station, said guide mechanism further being configured to allow said movable object cleaner to be displaced back to said operational position from said maintenance position;

a second movable object cleaner positioned adjacent to the other longer side of said polishing station; and a second guide mechanism operatively connected to said polishing station and said second movable object cleaner, said second guide mechanism being configured to allow said second movable object cleaner to be displaced from another operational position to another maintenance position to provide access to other parts of said polishing station, said second guide mechanism further being configured to allow said second movable object cleaner to be displaced back to said another operational position from said another maintenance position.

* * * * *